(12) United States Patent
Kim et al.

(10) Patent No.: US 11,437,088 B2
(45) Date of Patent: Sep. 6, 2022

(54) MEMORY DEVICE INCLUDING ROW DECODERS

(71) Applicant: SAMSUNG ELECTRONICS CO., LTD., Suwon-si (KR)

(72) Inventors: Youngjae Kim, Suwon-si (KR); Jincheol Kim, Seoul (KR); Ahreum Kim, Hwaseong-si (KR); Homoon Shin, Hwaseong-si (KR); Dooho Cho, Seoul (KR); Yongsung Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/239,655

(22) Filed: Apr. 25, 2021

(65) Prior Publication Data

US 2022/0084579 A1    Mar. 17, 2022

(30) Foreign Application Priority Data

Sep. 16, 2020   (KR) .......................... 10-2020-0119314

(51) Int. Cl.
| | |
|---|---|
| *G11C 11/408* | (2006.01) |
| *G11C 11/4074* | (2006.01) |
| *G11C 11/4093* | (2006.01) |
| *G11C 5/06* | (2006.01) |

(52) U.S. Cl.
CPC ............ *G11C 11/4087* (2013.01); *G11C 5/06* (2013.01); *G11C 11/4074* (2013.01); *G11C 11/4093* (2013.01)

(58) Field of Classification Search
CPC ... G11C 11/4087; G11C 5/06; G11C 11/4074; G11C 11/4093
See application file for complete search history.

(56) References Cited

U.S. PATENT DOCUMENTS

| | | |
|---|---|---|
| 5,517,457 A | 5/1996 | Sakui et al. |
| 5,708,621 A | 1/1998 | Tanoi |
| 5,864,496 A | 1/1999 | Mueller et al. |
| 6,191,999 B1 | 2/2001 | Fujieda et al. |

(Continued)

FOREIGN PATENT DOCUMENTS

| | | |
|---|---|---|
| JP | 05226613 A | 9/1993 |
| JP | 2004280867 A | 10/2004 |

(Continued)

*Primary Examiner* — Tri M Hoang
(74) *Attorney, Agent, or Firm* — Volentine, Whitt & Francos, PLLC

(57) ABSTRACT

A nonvolatile memory includes; a memory cell array including memory cells commonly connected to a first signal line, a first row decoder including a first pass transistor configured to provide a driving voltage to one end of the first signal line, and a second row decoder including a second pass transistor configured to provide the driving voltage to an opposing end of the first signal line. An ON-resistance of the first pass transistor is different from an ON-resistance of the second pass transistor. A first wiring line having a first resistance connects the first pass transistor and the one end of the first signal line and a second wiring line having a second resistance different from the first resistance connects the second pass transistor and the opposing end of the first signal line.

20 Claims, 19 Drawing Sheets

(56) References Cited

U.S. PATENT DOCUMENTS

| | | | |
|---|---|---|---|
| 7,158,398 B2 * | 1/2007 | Shimizu | H01L 27/115 365/185.23 |
| 7,274,584 B2 | 9/2007 | Jung et al. | |
| 7,719,919 B2 * | 5/2010 | Hamada | G11C 8/08 365/185.11 |
| 8,040,726 B2 | 10/2011 | Kwak | |
| 8,274,826 B2 * | 9/2012 | Hashimoto | G11C 16/06 365/185.11 |
| 8,699,294 B2 * | 4/2014 | Chung | G11C 8/08 365/231 |
| 8,982,639 B2 * | 3/2015 | Kim | G11C 16/0466 365/185.23 |
| 9,030,869 B2 * | 5/2015 | Yun | G11C 16/0483 365/185.11 |
| 9,437,300 B2 * | 9/2016 | Kamata | H01L 27/11582 |
| 10,319,738 B2 * | 6/2019 | Kim | G11C 8/08 |
| 10,643,704 B2 * | 5/2020 | Oh | G11C 5/063 |

FOREIGN PATENT DOCUMENTS

| | | |
|---|---|---|
| JP | 2009260083 A | 11/2009 |
| JP | 4391728 B2 | 12/2009 |
| KR | 101469097 | 12/2014 |

* cited by examiner

MEMORY DEVICE INCLUDING ROW DECODERS

CROSS-REFERENCE TO RELATED APPLICATION

This application claims priority under 35 U.S.C. § 119 to Korean Patent Application No. 10-2020-0119314 filed on Sep. 16, 2020 in the Korean Intellectual Property Office, the subject matter of which is hereby incorporated by reference.

BACKGROUND

The inventive concept relates generally to memory devices, and more particularly, to nonvolatile memory devices including a row decoder.

Memory devices are used to store data, and may be classified as volatile memory devices or nonvolatile memory devices. As an example of a nonvolatile memory device, a flash memory device may be used in a mobile phone, a digital camera, a personal digital assistant (PDA), a mobile computer device, a stationary computer device, and other devices.

Stacked memory devices have been developed in response to demands for high data storage capacity and miniaturization of nonvolatile memory devices. The term stacked memory device refers to a memory device including multiple memory cells or memory cell arrays vertically stacked on a substrate.

SUMMARY

Embodiments of the inventive concept provide nonvolatile memory devices including a first wiring resistance connected to one end of a signal line and a second wiring resistance connected to an opposing end of the signal line different from the first wiring resistance.

In one embodiment the inventive concept provides a nonvolatile memory device including; a memory cell array including memory cells commonly connected to a first signal line, a voltage generator configured to generate a driving voltage applied to the first signal line, a first row decoder including a first pass transistor configured to provide the driving voltage to a first wiring line having a first resistance, wherein the driving voltage is applied at a first end of the first signal line through the first wiring line, and a second row decoder including a second pass transistor configured to provide the driving voltage to a second wiring line having a second resistance, wherein the driving voltage is applied at a second end of the first signal line through the second wiring line, wherein the first resistance and the second resistance are different.

In another embodiment the inventive concept provides a memory device including; a memory cell array disposed in a memory cell area of a substrate, a first row decoder disposed in a first row decoder area of the substrate horizontally adjacent to one side of the memory cell area, and a second row decoder disposed in a second row decoder area of the substrate horizontally adjacent to another side of the memory cell area opposing the one side of the memory cell area, and a first signal line and a second signal line extending in parallel across the memory cell area between the first row decoder and the second row decoder, wherein the first row decoder includes first pass transistors configured to provide a driving voltage to one end of the first signal line through a first wiring line, and further configured to provide the driving voltage to one end of the second signal line through a second wiring line, the second row decoder includes second pass transistors configured to provide the driving voltage to an opposing end of the first signal line through a third wiring line, and further configured to provide the driving voltage to an opposing end of the second signal line through a fourth wiring line, the first wiring line having a first resistance value and the second wiring line having second resistance value different from the first resistance value, and the third wiring line having a third resistance value and the fourth wiring line having fourth resistance value different from the third resistance value.

In another embodiment the inventive concept provides a nonvolatile memory device including; a memory cell array including memory cells commonly connected to a first signal line, a first row decoder including a first pass transistor configured to provide a driving voltage to one end of the first signal line, and a second row decoder including a second pass transistor configured to provide the driving voltage to an opposing end of the first signal line, wherein an ON-resistance of the first pass transistor is different from an ON-resistance of the second pass transistor.

BRIEF DESCRIPTION OF THE DRAWINGS

The inventive concept may be more clearly understood upon consideration of the following detailed description taken in conjunction with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
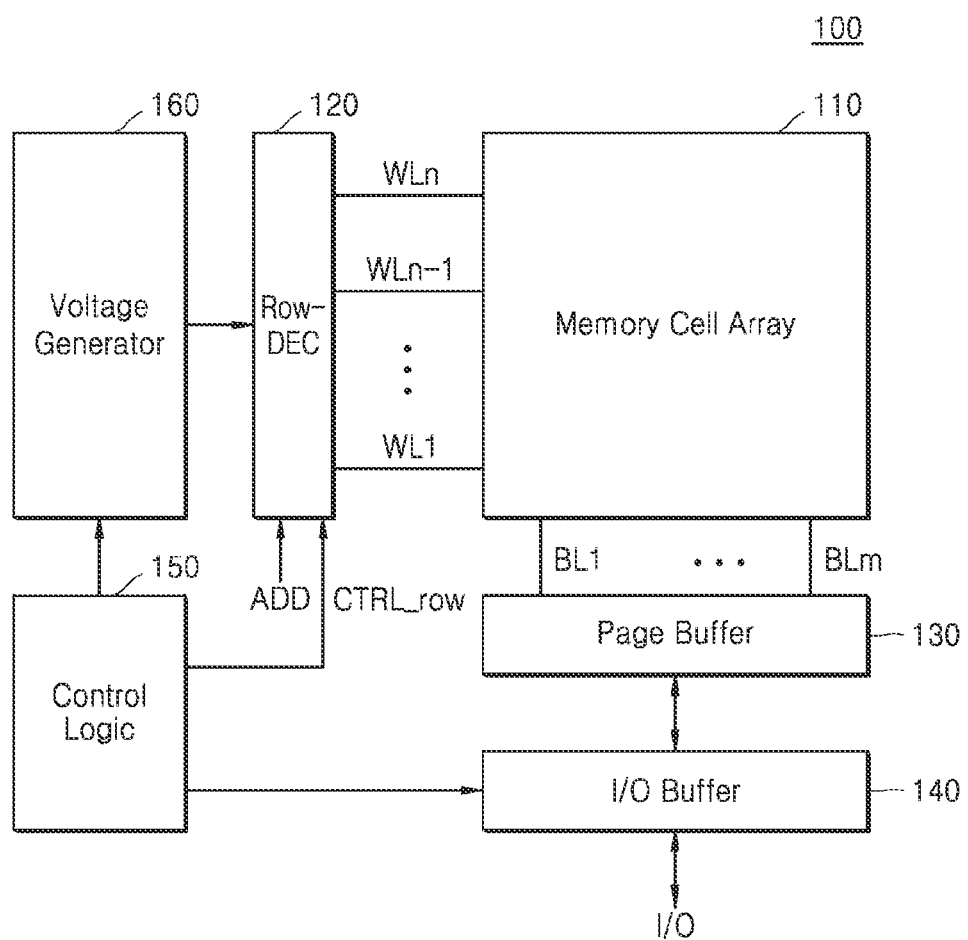
FIG. 1 is a block diagram illustrating a nonvolatile memory device according to embodiments of the inventive concept.

Figure (FIG. 1 is a block diagram illustrating a nonvolatile memory device 100 according to embodiments of the inventive concept. Referring to FIG. 1, the nonvolatile memory device 100 may include a memory cell array 110, a row decoder 120, a page buffer 130, an input/output (I/O) buffer 140, a control logic 150, and a voltage generator 160. Here, the nonvolatile memory device 100 may be (e.g.) a nonvolatile memory including at least one of a flash memory device, magneto-resistive random-access memory (MRAM), resistive RAM (ReRAM), and ferroelectric RAM (FRAM). In some embodiments, various memory devices including a row decoder configured to selectively drive row lines (e.g., word lines) may be applied to the nonvolatile memory device 100.

The memory cell array 110 may be connected to the row decoder 120 through word lines WL1 to WLn. Further, the memory cell array 110 may be connected to the page buffer 130 through bit lines BL1 to BLm. The page buffer 130 may operate as a write driver or as a sense amplifier according a selected operating mode. For example, during a program operation, the page buffer 130 may transmit a voltage corresponding to data to be programmed to the bit lines BL1 to BLm. Alternately, during a read operation, the page buffer 130 may sense data stored in a selected memory cell through the bit lines BL1 to BLm and transmit the data to the I/O buffer 140. The I/O buffer 140 may transmit the received data to the page buffer 130 or may output data provided from the page buffer 130 to the outside.

The control logic 150 may control various components included in the nonvolatile memory device 100. For example, the control logic 150 may generate internal control signals according to commands such as program/read commands from the outside. For example, the control logic 150 controls the voltage generator 160 to generate voltages of various levels used for programming/reading. Also, the control logic 150 may control input and output timing of data by controlling the I/O buffer 140. Also, according to embodiments of the inventive concept, the control logic 150 may generate a control CTRL_row CTRL that controls the row decoder 120. The row decoder 120 may perform a selected operation on a memory cell block (hereafter, a "memory block") and a signal line of the memory cell array 110 based on a control signal CTRL_row.

The voltage generator 160 may generate various types of word line voltages to be respectively supplied to word lines WL1 to WLn based on the control of the control logic 150 and a bulk voltage to be supplied to a bulk (e.g., a well area) in which memory cells are formed. For example, during a program operation, the voltage generator 160 may generate a program voltage provided to a selected word line and a pass voltage provided to a non-selected word line. Alternately, during a read operation, the voltage generator 160 may generate a selected word line voltage and a non-selected word line voltage having different levels. Alternately, during an erase operation, the voltage generator 160 may provide a high voltage erase voltage to a bulk in which a selected memory cell array is formed.

The memory cell array 110 may include multiple memory blocks. Only a single memory cell array 110 and a single row decoder 120 are illustrated in FIG. 1, but those skilled in the art will recognize that two or more row decoders may be disposed in one memory cell array 110. That is, one memory cell array 110 may receive driving voltages from one or more row decoders.

The row decoder 120 may perform an operation related to selection of a corresponding memory block. For example, when a memory block is selected, word line voltages may be provided to the word lines WL1 to WLn of the corresponding memory block, and when the memory block is not selected, the word line voltages may be blocked to be provided to the word lines WL1 to WLn of the corresponding memory block. In some embodiments, the row decoder 120 may include a block selector, and the transfer of word line voltages may be controlled through a switching operation of a pass transistor (e.g., TR_P in FIG. 2) provided in the block selector.

In some embodiments, the nonvolatile memory device 100 may be a flash memory device, and the memory cell array 110 may include multiple NAND cell strings. Each of the cell strings may form a channel in the vertical direction or a horizontal direction. Memory cells included in each of the cell strings may be programmed or erased by a high voltage provided from the row decoder 120.

Further, the memory cell array 110 may be connected to the row decoder 120 through other lines in addition to the word lines WL1 to WLn. For example, the memory cell array 110 may be connected to the row decoder 120 through one or more string selection lines SSL and a ground selection line GSL. In this regard, the string selection line SSL, the word lines WL1 to WLn, and the ground selection line GSL may be referred to as signal lines. Further, a voltage provided to the signal line may be referred to as a driving voltage.

Figure 2:
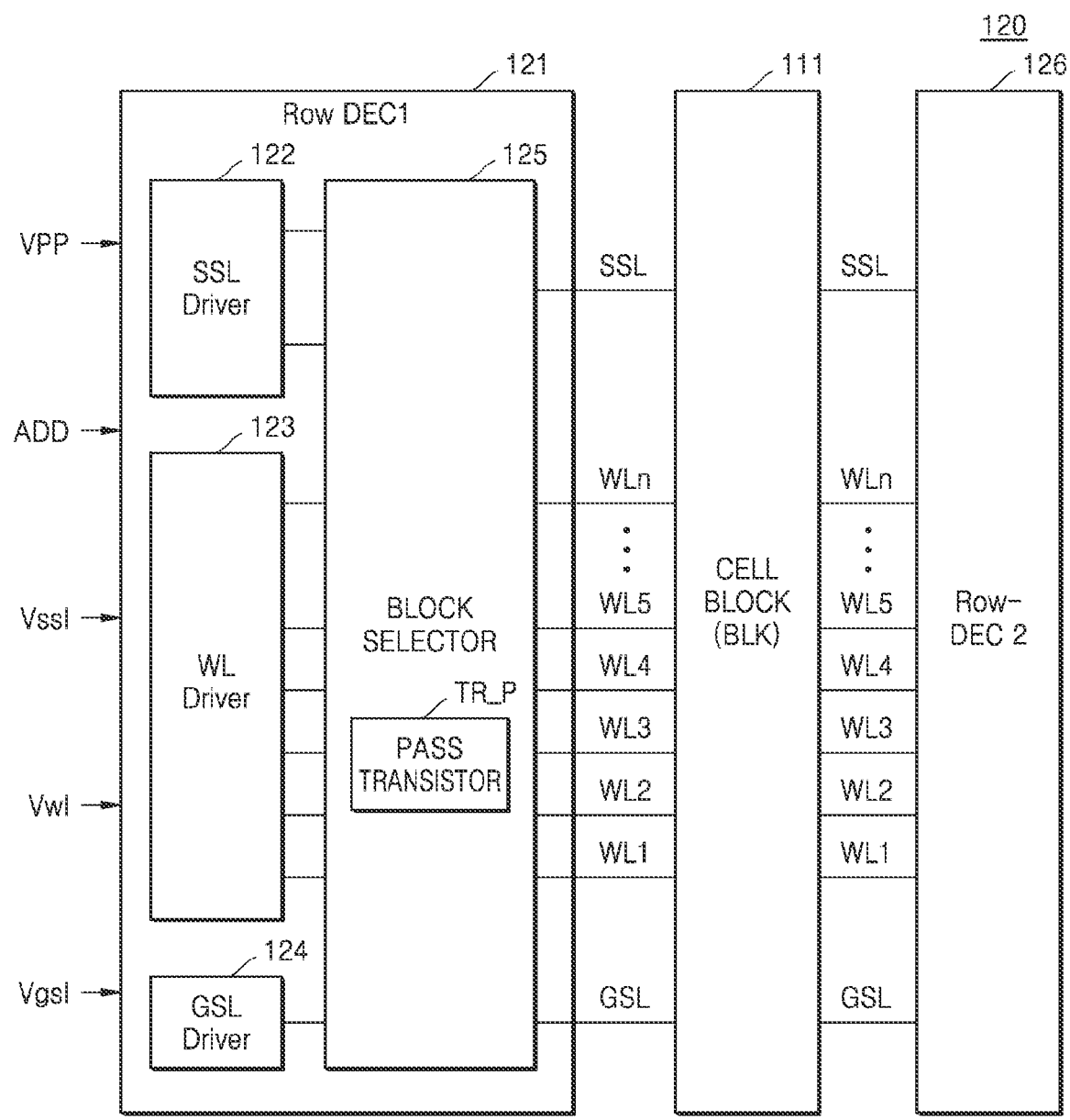
FIG. 2 is a block diagram illustrating an example implementation of a row decoder.

FIG. 2 is a block diagram further illustrating in one example the row decoder 120 of FIG. 1. Referring to FIGS. 1 and 2, and further assuming that the memory device 100 of FIG. 1 is a flash memory device, the row decoder 120 may include a first row decoder 121 and a second row decoder 126 configured to drive flash memory cells. Here, a memory block (BLK) 111 is shown in FIG. 2 as one exemplary memory block that may be selected from among the memory blocks included in the memory cell array 110. Thus, the first row decoder 121 may correspond to at least a portion (or part) of the row decoder 120 shown in FIG. 1, and the memory block 111 may receive at least one driving voltage from at least one of the first row decoder 121 and the second row decoder 126.

FIG. 2 further illustrates some embodiments in which at least one string selection line SSL and at least one ground selection line GSL may be respectively used to provide string selection signal(s) and/or ground selection signal(s) to the memory block 111.

Referring to FIG. 2, the first row decoder 121 may include a string selection line driver 122, a word line driver 123, a ground selection line driver 124, and a block selector 125. The block selector 125 may select a corresponding memory block by decoding at least some bits of an address ADD. In some embodiments, the block selector 125 may be disposed between the string selection line driver 122, the word line driver 123, the ground selection line driver 124 and the memory block 111.

The string selection line driver 122 is connected to the string selection line SSL through the block selector 125. That is, the string selection line driver 122 may drive the string selection line SSL through the block selector 125. For example, during an erase operation, the string selection line driver 122 may float the string selection line SSL, and during a program operation, the string selection line driver 122 may provide a high-voltage string selection voltage (e.g., a power voltage) to the string selection line SSL.

Similarly, the word line driver 123 is connected to the word lines WL1 to WLn through the block selector 125. That is, the word line driver 123 may drive the word lines WL1 to WLn through the block selector 125. For example, during the erase operation, a high voltage erase voltage is applied to a bulk in which the memory block 111 is formed, and the word line driver 123 may apply a relatively low level word line voltage (e.g., a ground voltage) to the word lines WL1 to WLn. In addition, during the program operation, the word line driver 123 may provide a program voltage having a high level to a selected word line, and may provide a pass voltage to a non-selected word line.

Also similarly, the ground selection line driver 124 may drive a ground selection line GSL through the block selector 125. For example, during the erase operation, the ground selection line driver 124 may float the ground selection line GSL, and during the program operation, the ground selection line driver 124 may provide a low level ground selection voltage (e.g., the ground voltage) to the ground selection line GSL.

The block selector 125 may include multiple pass transistors TR_P connected between the drivers, that is, the string selection line driver 122, the word line driver 123, and the ground selection line driver 124, and the signal lines SSL, WL1 to WLn, and GSL. The operation of the signal lines SSL, WL1 to WLn, and GSL may be controlled based on the switching operation of the pass transistors TR_P.

In some embodiments, the second row decoder 126 may have the same configuration as the first row decoder 121. Accordingly, since the memory block 111 may receive a driving voltage from either one of the first decoder 121 or the second decoder 126, a time required to set up and apply the driving voltage to the signal line may be reduced, as compared with memory devices providing a similar driving voltage from only a single row decoder. Here, it should be noted that as the number of word lines in a memory device increases, a spacing between adjacent wiring lines connecting respective pass transistors to respective word lines may become increasingly narrow. Further, the length(s), thickness(es) and/or shape(s) of these wiring lines may vary as a function of related spacing constraints. Accordingly, variation (including possible deviation(s) from specification) in resistance values for the wiring lines connected to various signal lines may arise. And such deviation in resistance values may adversely affect the timing associated with the set up and application of the driving voltage to signal lines.

Figure 3:
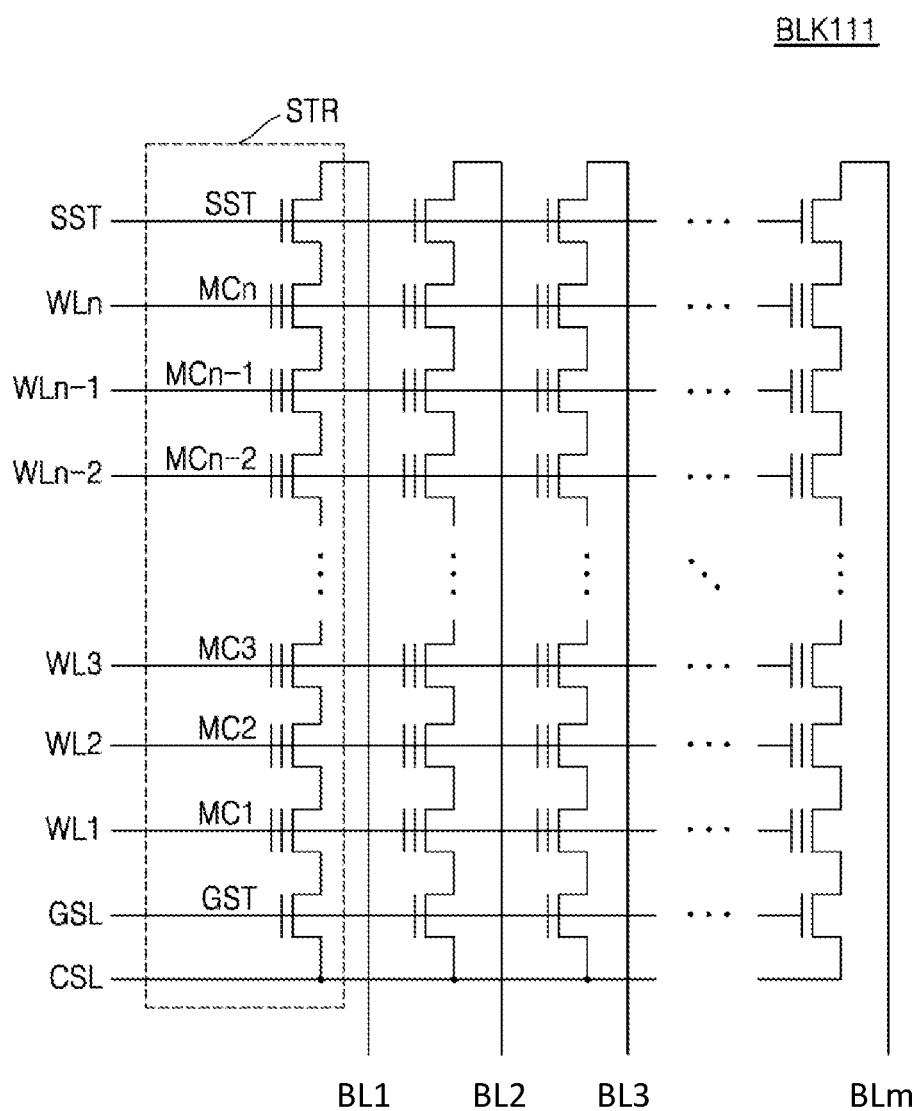
FIG. 3 is a circuit diagram illustrating a memory block according to embodiments of the inventive concept.

FIG. 3 is a partial circuit diagram further illustrating in one example the memory block BLK111 of FIG. 2.

Referring to FIGS. 1, 2 and 3, the memory cell array 110 of FIG. 1 is assumed to be a horizontal NAND flash memory including multiple memory blocks, wherein each memory block includes 'm' cell strings STR series connecting memory cells MC in a direction of the bit lines BL1 to BLm (m being an integer greater than 1).

The NAND flash memory device of FIG. 3 may perform an erase operation in units of cell blocks, while performing a programming operation in units of pages in relation to the word lines WL1 to WLn. Here, the memory block 111 may include 'n' pages corresponding to the respective 'n' word lines WL1 to WLn, for example.

Figure 4:
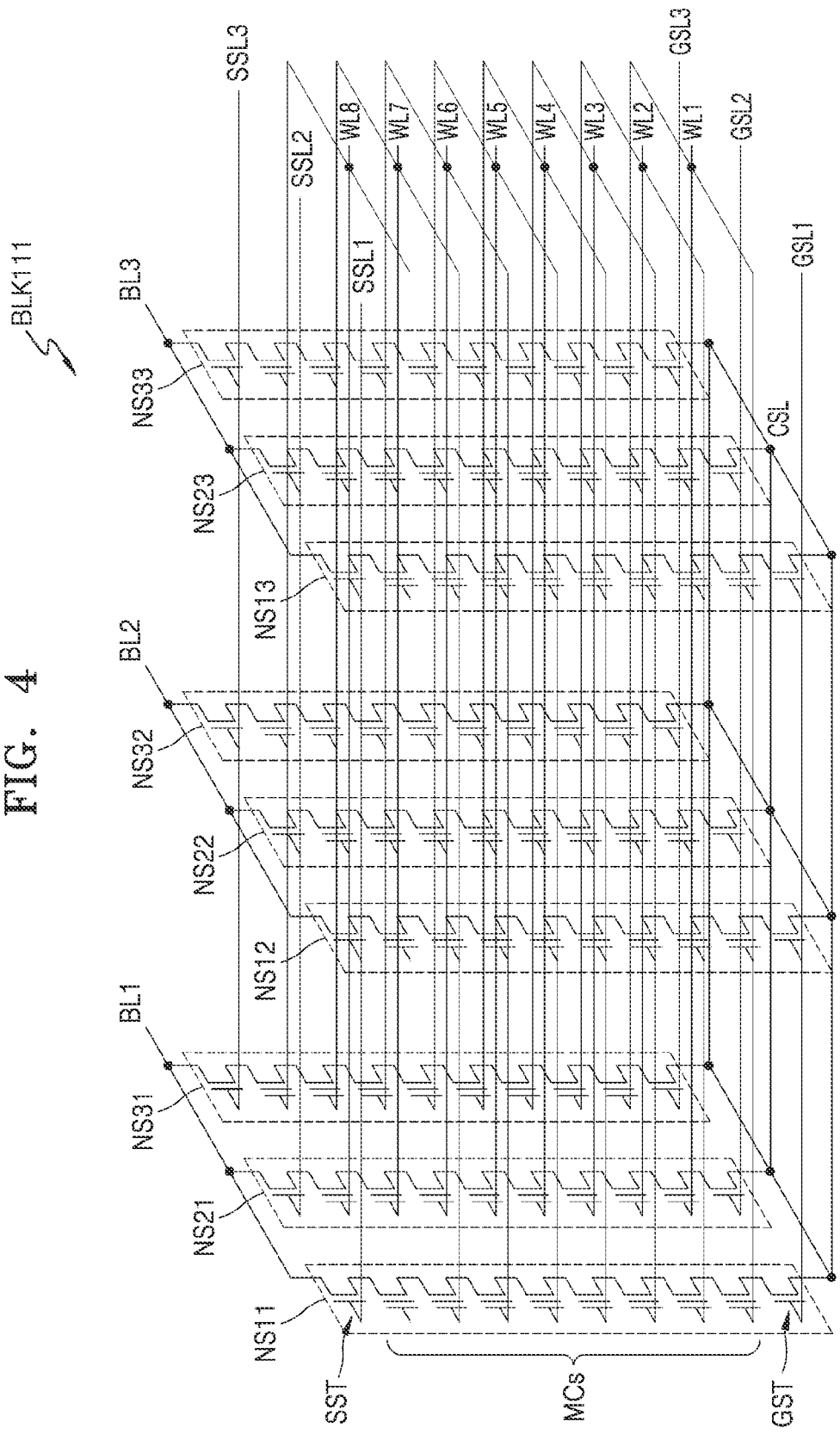
FIG. 4 is a circuit diagram illustrating another example of a memory block included in a memory cell array according to embodiments of the inventive concept.

FIG. 4 is a partial circuit diagram further illustrating in one example the memory block 111 of FIGS. 2 and 3.

Here, FIG. 4 shows an example in which the memory block 111 includes eight word lines WL1 to WL8, three NAND cell strings NS11 to NS33, eight word lines WL1 to WL8, and three bit lines BL1 to BL3, as well as ground selection lines GSL1 to GSL3, cell string selection lines SSL1 to SSL3 and a common source line CSL. However, those skilled in the art will understand a particular number of NAND cell strings, number of word lines, number of bit lines, number of ground selection lines, and number of cell string selection lines is a matter of design choice.

In FIG. 4, the NAND cell strings NS11, NS21, and NS31 are provided between the first bit line BL1 and the common source line CSL. The NAND cell strings NS12, NS22, and NS32 are provided between the second bit line BL2 and the common source line CSL. The NAND cell strings NS13, NS23, and NS33 are provided between the third bit line BL3 and the common source line CSL. Each NAND cell string (e.g., NS11) may include a cell string selection transistor SST connected in series with memory cells MC1 to MC8 and a ground selection transistor GST.

Cell strings commonly connected to one bit line constitute one column. For example, the cell strings NS11, NS21, and NS31 commonly connected to the first bit line BL1 may correspond to a first column, the cell strings NS12, NS22, and NS32 commonly connected to the second bit line BL2 may correspond to a second column, and the cell strings NS13, NS23, and NS33 commonly connected to the third bit line BL3 may correspond to a third column.

Cell strings connected to one cell string selection line may constitute one row. For example, the cell strings NS11, NS12, and NS13 connected to the first cell string selection line SSL1 may correspond to a first row, the cell strings NS21, NS22, and NS23 connected to the second cell string selection line SSL2 may correspond to a second row, and the cell strings NS31, NS32, and NS33 connected to the third cell string selection line SSL3 may correspond to a third row.

The cell string selection transistor SST is connected to the corresponding cell string selection lines SSL1 to SSL3. The plurality of memory cells MC1 to MC8 are connected to the corresponding word lines WL1 to WL8, respectively. The ground selection transistor GST is connected to the corresponding ground selection lines GSL1 to GSL3. The cell string selection transistor SST is connected to the corresponding bit lines BL1 to BL3, and the ground selection transistor GST is connected to the common source line CSL.

Word lines (e.g., WL1) disposed at the same height (e.g., a distance measured in the vertical direction) may be commonly connected. The cell string selection lines SSL1 to SSL3 are separate from each other, and the ground selection lines GSL1 to GSL3 are also separate from each other. Thus, for example, when a programming operation is applied to memory cells connected to the first word line WL1 and belonging to the cell strings NS11, NS12, and NS13, the first word line WL1 and the first cell string selection line SSL1 will be selected.

Here, the ground selection lines GSL1 to GSL3 may be commonly connected.

Figure 5:
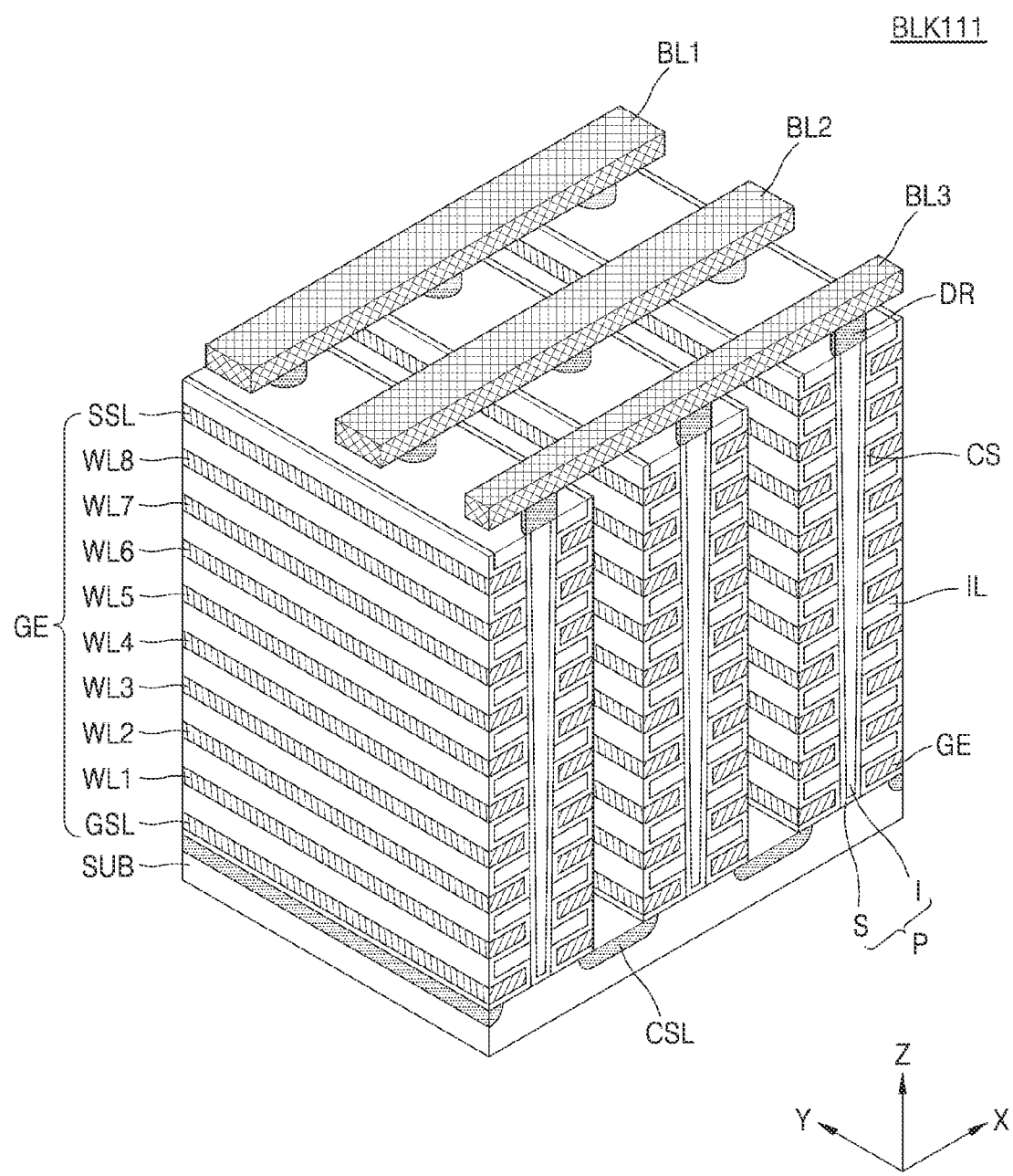
FIG. 5 is a perspective view illustrating the memory block of FIG. 4.

FIG. 5 is a perspective view further illustrating in one example the memory block BLK111 of FIGS. 2, 3 and 4.

Referring to FIG. 5, the memory block 111 may extend substantially in the vertical direction (e.g., the Z direction) perpendicular to the substrate SUB which extends in a horizontal plane defined by a first horizontal direction (e.g., the X direction) and a second horizontal direction (e.g., the Y direction). Consistent with FIG. 4, the memory block BLK 111 of FIG. 5 includes two selection lines GSL and SSL, eight word lines WL1 to WL8 and three bit lines BL1 to BL3.

The substrate SUB has a first conductivity type (e.g., p-type), extends in a second direction on the substrate SUB, and provides the common source line CS doped with impurities of a second conductivity type (e.g., n-type) On a region of the substrate SUB between two adjacent common source lines CSL, multiple insulating layers IL extending in the X direction are sequentially provided in the Z direction, and the insulating layers IL are spaced apart by a specific distance in the Z direction. For example, the insulating layers IL may include one or more insulating materials, such as silicon oxide.

Pillars P may be sequentially disposed on a region of the substrate SUB between two adjacent common source lines CSL in the X direction and passing through the insulating layers IL in the Z direction. For example, the pillars P may pass through the insulating layers IL to contact the substrate SUB. Specifically, a surface layer S of each pillar P may include a silicon material having the first conductivity type, and may function as a channel region. Further, an inner layer I of each pillar P may include an insulating material such as silicon oxide or an air gap.

In the region between the two adjacent common source lines CSL, a charge storage layer CS is provided along exposed surfaces of the insulating layers IL, the pillars P, and the substrate SUB. The charge storage layer CS may include a gate insulating layer (e.g., a tunneling insulating layer), a charge trap layer, and a blocking insulating layer. For example, the charge storage layer CS may have an oxide-nitride-oxide (ONO) structure. Further, in the region between the two adjacent common source lines CSL, on the exposed surface of the charge storage layer CS, a plurality of gate electrodes GE such as the selection lines GSL and SSL and the word lines WL1 to WL8 are provided.

Drains or drain contacts DR are respectively provided on each pillar P. For example, the drains or drain contacts DR may include a silicon material doped with impurities having a second conductivity type. On the drains DR, the bit lines BL1 to BL3 extending in the X direction and spaced apart by a specific distance in the Y direction are provided.

Figure 6:
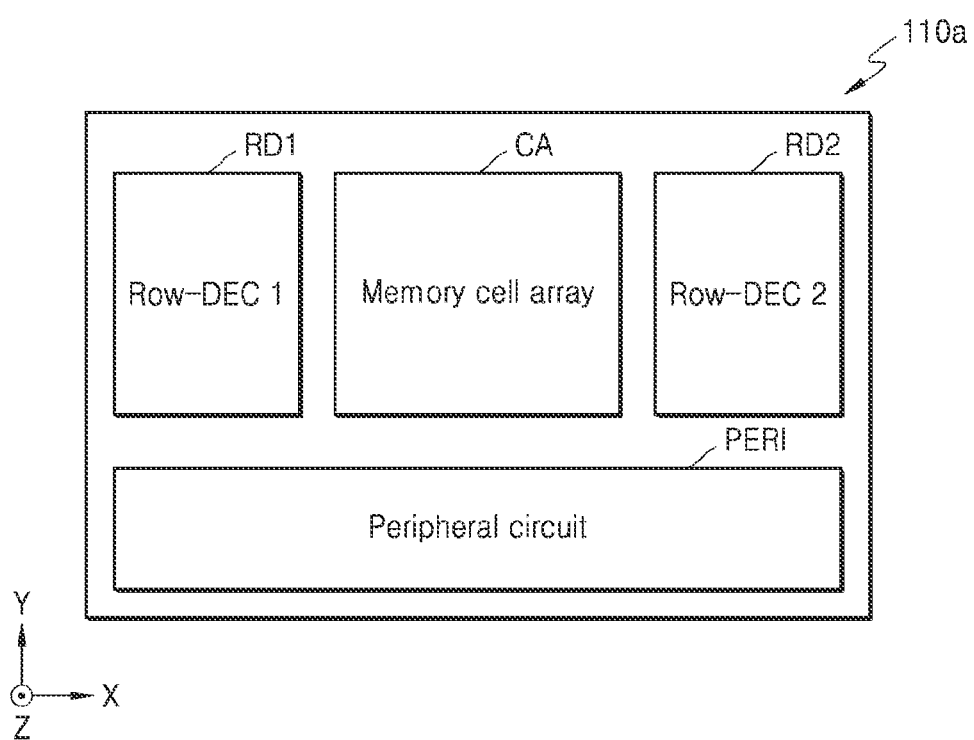
FIG. 6 is a diagram illustrating an arrangement of components included in a nonvolatile memory device according to embodiments of the inventive concept.

FIG. 6 is a block diagram illustrating one possible arrangement of components included in a nonvolatile memory device 110a according to embodiments of the inventive concept. Referring to FIG. 6, the nonvolatile memory device 100a may be variously implemented as a semiconductor chip including a memory cell array area CA, a first row decoder area RD1, a second row decoder area RD2 and a peripheral circuit area PERI.

Here, for example, the memory cell array 100 of FIG. 1 may be disposed in the memory cell array area CA. The first row decoder 121 and the second row decoder 126 of FIG. 2 may be respectively disposed in the first row decoder area RD1 and the second row decoder area RD2, wherein the first row decoder area RD1 and the second row decoder area RD2 are horizontally (or laterally) disposed (e.g., in the first horizontal (or X) direction) on opposing sides of the memory cell array area CA.

The peripheral circuit area PERI may extend, such that it is adjacent to the memory cell array area CA, the first row decoder area RD1 and the second row decoder area RD2 (e.g., in the second horizontal (or Y) direction). Page buffer(s), data I/O circuit(s), etc. may be disposed in the peripheral circuit area PERI.

With this configuration, the first row decoder (Row-DEC1 or 121 of FIG. 2) and the second row decoder (Row-DEC2 or 126 of FIG. 2) may be respectively disposed in the first row decoder area RD1 and the second row decoder area RD2 in order to provide various driving voltage(s) to the memory cell array 100 disposed in the memory cell area CA. Accordingly, various driving voltage(s) may be applied to various signal lines with a reduced and more predictable time(s), as compared with memory devices including only a single row decoder applying such driving voltage(s).

Figure 7:
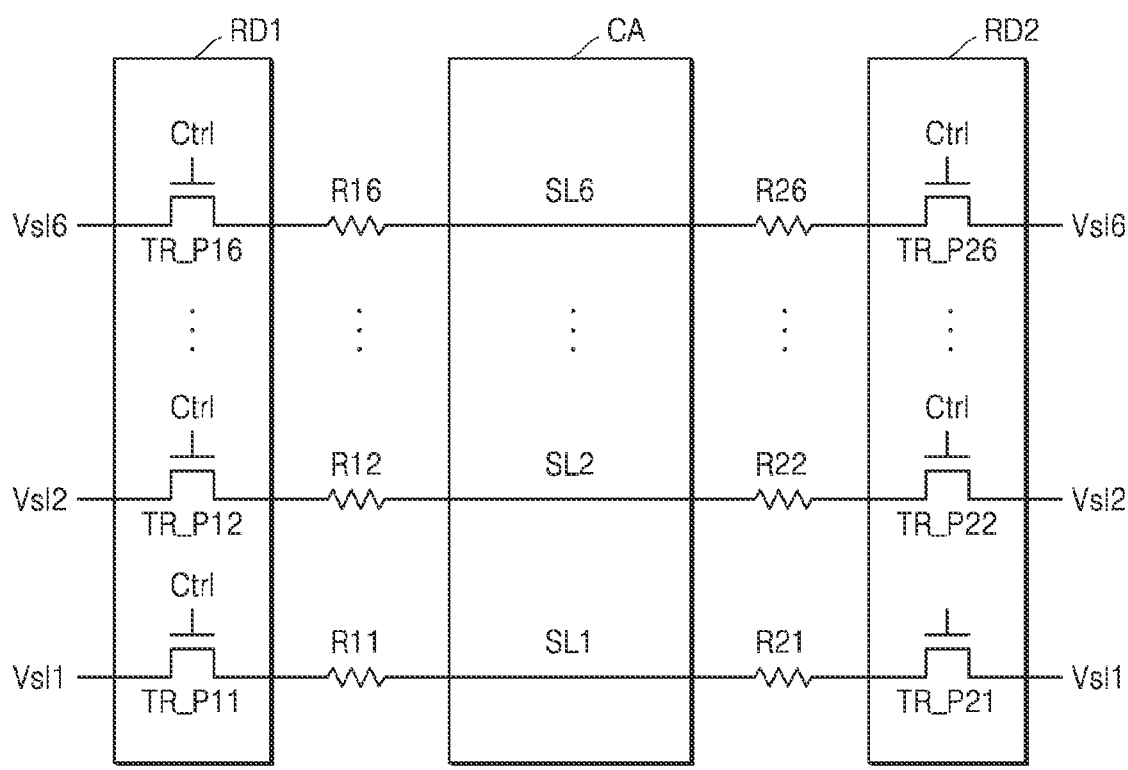
FIG. 7 is a diagram illustrating wiring resistance according to embodiments of the inventive concept.

FIG. 7 is a conceptual diagram further illustrating in one example the configuration of components shown in FIG. 6, and including wiring resistance(s) according to embodiments of the inventive concept. Referring to FIG. 7, signal lines SL1 to SL6 are assumed to extend across the memory cell array area CA. Each of the signal lines SL1 to SL6 may be variously connected to memory cells (not shown), and the signal lines SL1 to SL6 may be respectively configured to function as a string selection line SSL, a word line WL, a ground selection line GSL, or a common source line CSL, consistent with the embodiments previously described in relation to FIGS. 2 and 3. However, those skilled in the art will recognize that the illustrated example of FIG. 7 is a simplified example presented merely to facilitate a convenient description of the making and use of embodiments of the inventive concept.

The first row decoder area RD1 may include first pass transistors (e.g., TR_P11 to TR_P16) that may be used to selectively transfer a driving voltage among multiple driving voltages (e.g., Vsl1 to Vsl6) to one or more of the signal lines SL1 to SL6 in response to a switching operation controlled by a control signal Ctrl. Here, the control signal Ctrl is one example of the control signal CTRL_row shown in FIG. 1.

In similar manner, the second row decoder area RD2 may include second pass transistors (e.g., TR_P21 to TR_P26) that may be used to selectively transfer the driving voltages Vsl1 to Vsl6 to the signal lines SL1 to SL6 in response to switching in accordance with the control signal Ctrl.

Here, the wiring lines connecting the first pass transistors TR_P11 to TR_P16 and the signal lines SL1 to SL6 may be respectively modeled according to a number of first wiring resistances (e.g., R11 to R16), and the wiring lines connecting the second pass transistors TR_P21 to TR_P26 and the signal lines SL1 to SL6 may be respectively modeled according to a number of second wiring resistances (e.g., R21 to R26). For example, a wiring line connecting the first pass transistor TR_P11 to the first signal line SL1 may be modeled as the wiring resistance R11.

Here, because driving voltages may be applied at both ends (e.g., a "first end" and a "second end") of the memory cell array, the overall time required to set up the signal line in relation to an applied driving voltage may be reduced. Additionally, because driving voltages may be applied at both ends of the memory cell array, the effective resistance of respective signal lines associated with either one of the row decoders may be decreased. Accordingly, potentially adverse influence(s) due to variations in the resistance of the wiring lines upon the setup time of the driving voltages may be reduced or eliminated.

For example, as described in relation to FIG. 2, as a space allocated to the various wiring line narrows (or becomes more crowded with an increasing number of signal lines), undesired deviation(s) in the resistance values of the wiring line may arise. That is, resistance value deviation(s) between the first wiring resistances R11, R12 . . . and R16 and/or resistance value deviation(s) between the second wiring resistances R21, R22 . . . and R26 may arise. In order to prevent this from happening, nonvolatile memory devices according to embodiments of the inventive concept provide wiring lines having different resistance values that may be connected to both ends of various signal line(s), thereby reducing a setup time deviation between the signal lines.

Figure 8:
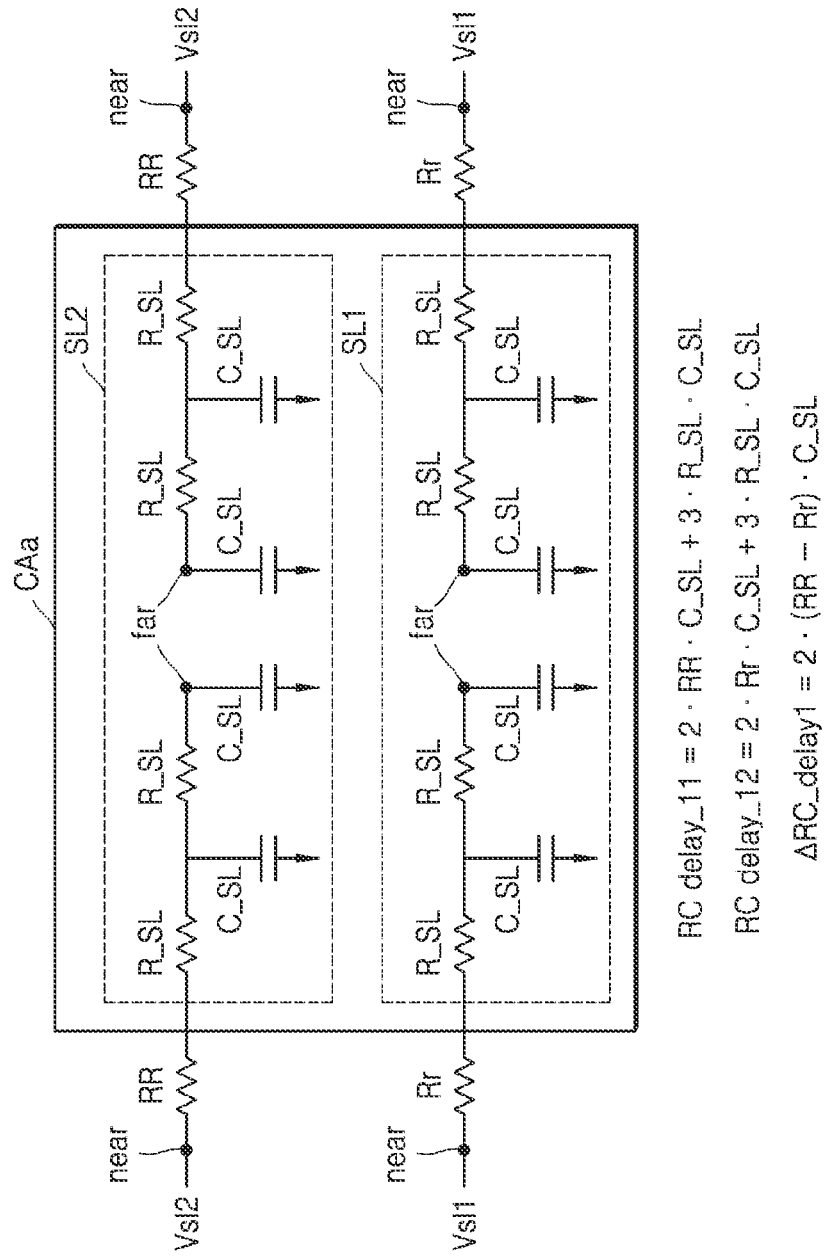
FIG. 8 is a diagram illustrating an RC delay when the same wiring resistance is connected to both ends of a word line.

FIG. 8 is another conceptual diagram illustrating a resistance (R)—capacitance (C) delay (an RC delay) that may arise when a same wiring resistance is connected at both ends of signal lines. Referring to FIG. 8, a first signal line SL1 and a second signal line SL2 may be expressed according to 4-pi modeling. That is, each of the first signal line SL1 and the second signal line SL2 may be modeled as a word line having a word line resistance R_SL and a word line capacitance C_SL.

A same resistance may then be connected at both ends of each signal line. For example, a first resistance Rr may be connected at both ends of the first signal line SL1 and a second resistance RR may be connected at both ends of the second signal line SL2, wherein the second resistance RR is greater than the first resistance Rr. However, since the resistance connected at both ends of the signal line is the same, the length, width, and/or arrangement of the wiring lines connected at both ends of the signal line may also be the same.

A "far point" (relative to the row decoder) along the signal line may be a point at which the RC delays of driving voltages respectively applied at "near points" (relative to the row decoder) at both ends of the signal line are the same. Here, because the resistance connected at both ends of the signal line is the same, the far point may be a middle point along the signal line.

In this regard, a first RC delay (RC delay_11) for the first signal line SL1 may be calculated using Equation 1, and a second RC delay (RC delay_12) for the second signal line SL2 may be calculated using Equation 2.

$$RC\ delay\_11 = 2\cdot RR\cdot C\_SL + 3\cdot R\_SL\cdot C\_SL \qquad \text{[Equation 1]}$$

$$RC\ delay\_12 = 2\cdot Rr\cdot C\_SL + 3\cdot R\_SL\cdot C\_SL \qquad \text{[Equation 2]}$$

Accordingly, a difference ($\Delta RC\_delay1$) between the first RC delay and the second RC delay RC may be calculated using Equation 3.

$$\Delta RC\_delay1 = 2\cdot (RR-Rr)\cdot C\_SL \qquad \text{[Equation 3]}$$

That is, the difference in respective RC delays, as between the first signal line SL1 and the second signal line SL2, may be proportional to twice (2×) a difference between the second resistance RR and the first resistance Rr.

Figure 9:
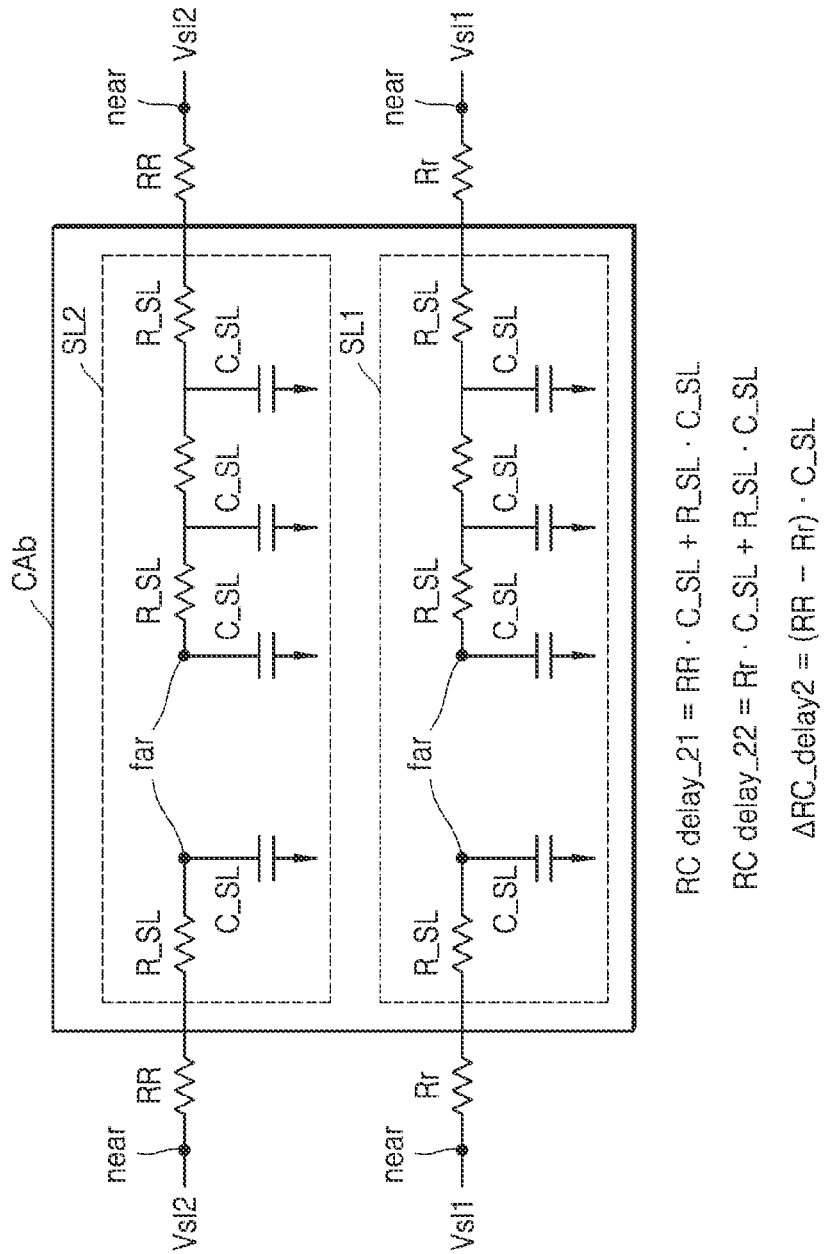
FIG. 9 is a diagram illustrating an RC delay when different wiring resistances are connected to opposing ends of a signal line.

In contrast to the example of FIG. 8, FIG. 9 is another conceptual diagram illustrating an RC delay when different wiring resistances are respectively connected at opposing ends of a signal line. Referring to FIG. 9, it is assumed that different resistances are connected to different ends of the first and second signal lines. For example, the first resistance Rr may be connected to opposing ends of the first signal line SL1 and the second resistance RR may be connected to opposing ends of the second signal line SL2. Here, because the respective resistances (RR and Rr) connected at opposing ends of each signal line are different, the length, width, and/or arrangement of wiring lines connected at the opposing ends of the signal line may be different.

Additionally, because different resistances are connected at opposing ends of each signal line, the resulting "far point" may not correspond with a middle point of each signal line. For example, referring to FIG. 7, when a resistance value of the first resistance RR is assumed to be three times (3×) the resistance value of the second resistance Rr, a 1:3 point of the length of the first signal line SL1 may be the far point.

Accordingly, a new first RC delay (RC delay_21) for the first signal line SL1 may be calculated using Equation 4, and a new second RC delay (RC delay_22) for the second signal line SL2 may be calculated using Equation 5.

$$RC\ delay\_21 = RR\cdot C\_SL + R\_SL\cdot C\_SL \qquad \text{[Equation 4]}$$

$$RC\ delay\_22 = Rr\cdot C\_SL + R\_WL\cdot C\_SL \qquad \text{[Equation 5]}$$

Accordingly, a new difference ($\Delta RC\_delay2$) between the new first RC delay (RC delay_21) and the new second RC delay (RC delay_22) may be calculated using Equation 6.

$$\Delta RC\_delay2 = (RR-Rr)\cdot C\_SL \qquad \text{[Equation 6]}$$

That is, the difference in the RC delays between the first signal line SL1 and the second signal line SL2 may be proportional to the difference between the second resistance RR and the first resistance Rr.

Looking at Equations 3 and 6, when wiring resistances having different resistance values are connected at opposing ends of a signal line, a difference in the RC delay between adjacent signal lines may be reduced. As a result, when lengths, widths, and/or arrangement of wiring lines connected to opposing ends of the signal line are different, a deviation in the setup time between signal lines may be reduced.

Figure 10:
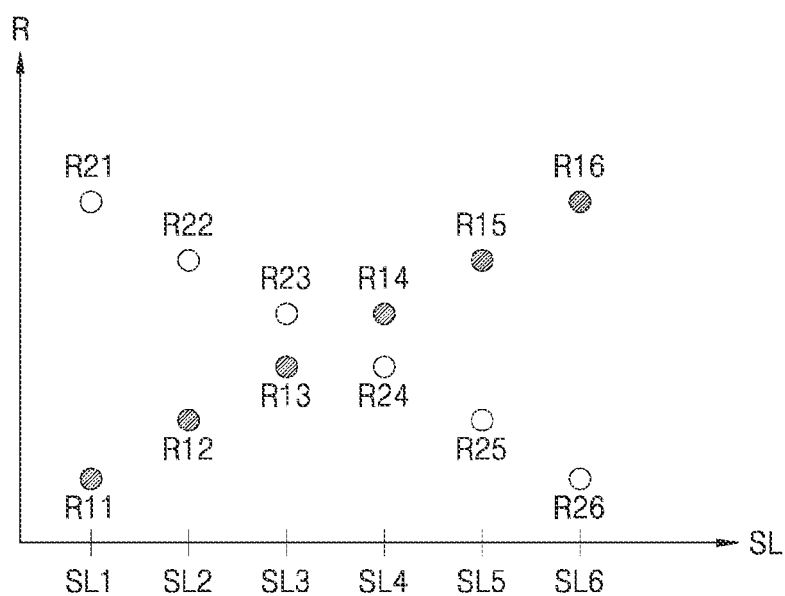
FIG. 10 is a diagram illustrating an example of a wiring resistance arrangement according to the inventive concept.

FIG. 10 is a graph plotting examples of various wiring resistance arrangements according to embodiments of the inventive concept. Referring to FIGS. 7, 8, 9, and 10, wiring resistances R11 to R16 connected to one end of the signal lines SL1 to SL6 may be arranged in an order of increasing resistance value. For example, the resistance value may increase from the wiring resistances R11 to R16. In contrast, the wiring resistances R21 to R26 connected to opposing ends of the signal lines SL1 to SL6 may be arranged in an order of decreasing resistance value.

As a number of signal lines increases, allocated space for arranging the wiring lines becomes relatively narrow. Thus, wiring lines having various widths, various lengths, or various forms may be arranged at opposing ends of the signal lines. In this regard, as described above with reference to FIG. 9, when wiring lines having different resistance values are connected to opposing ends of a signal line, a setup time deviation between adjacent signal lines may be reduced. In other words, when the average of wiring resistances connected at both ends of the signal lines is reduced, the setup time deviation may decrease.

Therefore, as shown in FIG. 10, wiring lines may be arranged at one end of the signal lines SL1 to SL6 in an order of increasing resistance value, and wiring lines may be arranged at opposing ends of the signal lines SL1 to SL6 in an order of decreasing resistance value. That is, wiring lines having different lengths are disposed at one end of the signal lines SL1 to SL6, and wiring lines having different lengths are disposed at the other end of the signal lines SL1 to SL6, thereby effectively reducing the setup time deviation.

Figure 11:
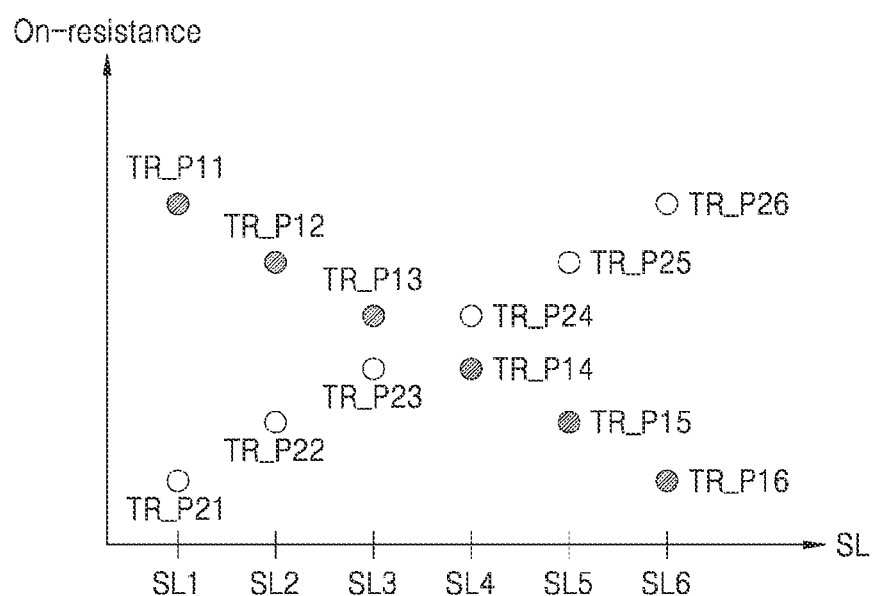
FIG. 11 is a diagram illustrating an example of on-resistance of a pass transistor according to embodiments of the inventive concept.

FIG. 11 is another graph plotting example of ON-resistance for a pass transistor according to embodiments of the inventive concept. Referring to FIGS. 7 and 11, the first pass transistors TR_P11 to TR_P16 may be disposed at one end of the signal lines SL1 to SL6 in an order of decreasing ON-resistance. For example, the ON-resistance may decrease from the first pass transistors TR_P11 to TR_P16. In contrast, the second pass transistors TR_P21 to TR_P26 may be disposed at other end of the signal lines SL1 to SL6 in an order of increasing ON-resistance. For example, the ON-resistance may increase from the second pass transistors TR_P21 to TR_P26.

Here, the ON-resistance of the pass transistor may be determined according to the size of the pass transistor, wherein the "size" of the pass transistor is determined by the channel length and/or channel width of the pass transistor.

As the number of signal lines increases, a space allocated for the arranging of the wiring lines becomes relatively more narrow, and thus, wiring lines having various widths, various lengths, and/or various shapes may be disposed at opposing ends of the signal lines. Accordingly, various resistance values for the wiring lines may be used to effectively compensate for the ON-resistance of the pass transistor disposed in a path through which the driving voltage is transmitted to the signal line. For example, as shown in FIG. 10, the resistance of paths connected to the signal lines may be equalized by maximizing the ON-resistance of the first pass transistor TR_P11 connected to the wiring resistance R11 having the lowest resistance value, and minimizing the ON-resistance of the first pass transistor TR_P16 connected to the wiring resistance R16 having the highest resistance value.

As a result, the first pass transistors TR_P11 to TR_P16 disposed at one end of the signal lines and the second pass transistors TR_P21 to TR_P26 disposed at the other end thereof may have different ON-resistances. Specifically, because pass transistors compensate for the wiring resistance, when the corresponding wiring resistance is different, the ON-resistance of the pass transistor may be different. Accordingly, the first pass transistors TR_P11 to TR_P16 disposed at one end of the signal lines and the second pass transistors TR_P21 to TR_P26 disposed at other end thereof may have different sizes.

Figure 12:
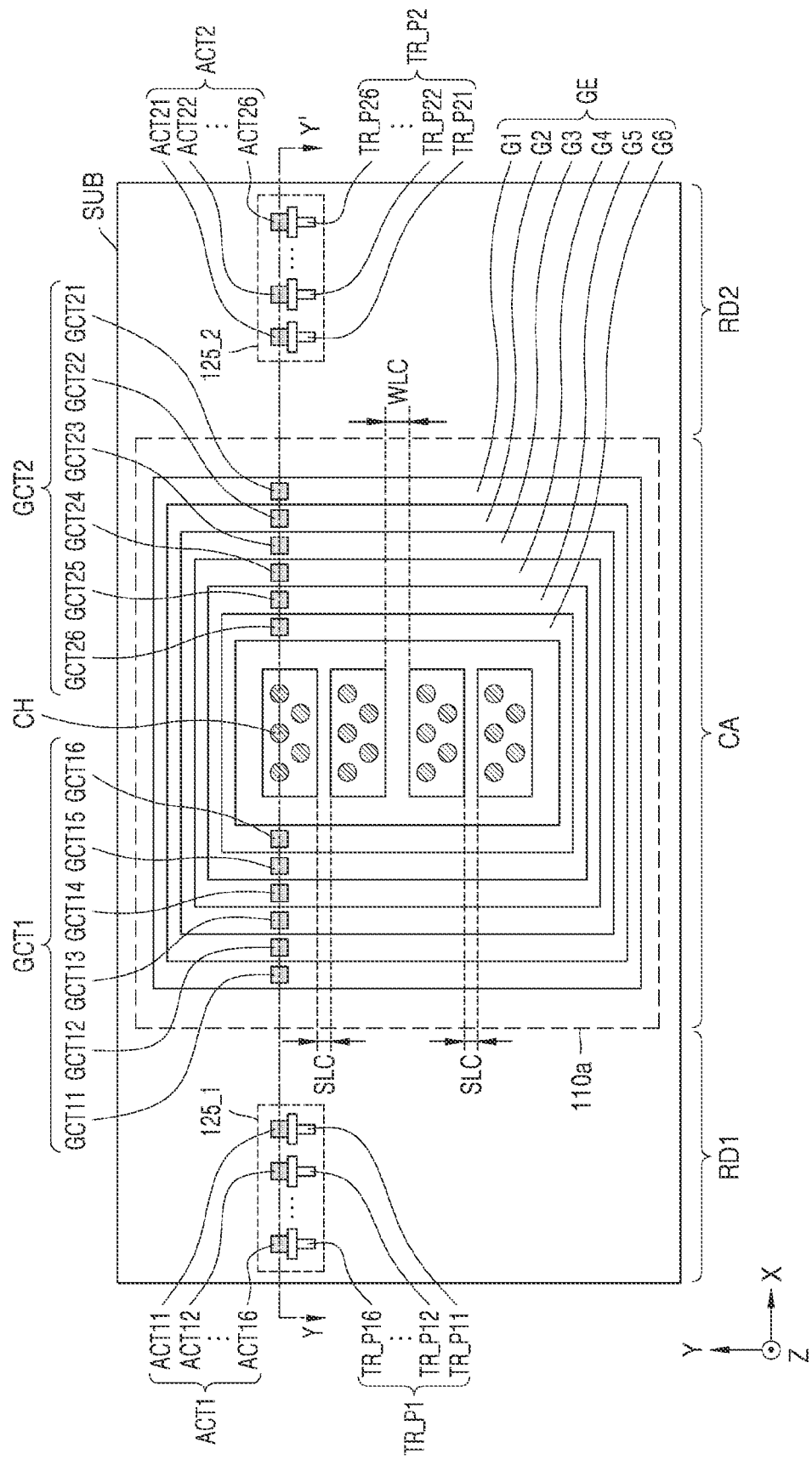
FIG. 12 is a plan view illustrating a semiconductor device according to embodiments of the inventive concept.

FIG. 12 is a plan (or top down) view illustrating a semiconductor device 100b according to embodiments of the inventive concept.

Referring to FIG. 12, the semiconductor device 100b may include the memory cell array area CA, the first row decoder area RD1 and the second row decoder area RD2 formed in a principal surface of a substrate SUB.

Here, the principal surface of the substrate SUB extends in the first direction and the second direction. In some embodiments, the substrate SUB may include Si, Ge, or SiGe. In other embodiments, the substrate SUB may include a poly silicon substrate, a silicon-on-insulator (SOI) substrate, or a germanium-on-insulator (GEO) substrate.

A memory cell array 110a may be a vertically-stacked memory cell array formed in the memory cell array area CA. Channel holes CH and gate conductive layers GE may be formed on the substrate SUB as constituent components of the memory cell array 110a. In some embodiments, the memory cell array 110a may have a configuration substantially similar to that of the memory cell array described in FIGS. 4, 5 and/or 6.

The channel holes CH may pass through the gate conductive layers GE and vertically extend in the third direction perpendicular to an upper surface of the substrate SUB, and a bottom surface of the channel hole CH may reach the upper surface of the substrate SUB. The channel holes CH may be respectively spaced apart in the first direction and the second direction.

A first block selector 125_1 may be formed in the first row decoder area RD1. Here, the first block selector 125_1 may include first pass transistors TR_P1. (However, for clarity of illustration, the first pass transistors TR_P11 are shown in FIG. 12 as being arranged side by side, but the inventive concept is not limited thereto. A first pass transistors TR_P1 may serve as an example of the first pass transistors TR_P11 to TR_P16 described with respect to FIG. 11. A second block selector 125_2 may be formed in the second row decoder area RD2, and include second pass transistors TR_P2. A second pass transistors TR_P2 may serve as an example of the second pass transistors TR_P21 to TR_P26 described with respect to FIG. 11. Although not shown, the string selection line driver 122, the word line driver 123, and the ground selection line driver 124 described above with reference to FIG. 2 may be formed in each of the first and second row decoder areas RD1 and RD2.

Vertically stacked, first through sixth gate electrodes G1 to G6 constituting the gate conductive layers GE may variously constitute word lines, string selection lines, ground selection lines, etc. Of note in this regard, area(s) allocated to the first through sixth gate electrodes G1 to G6 may decrease in size as a corresponding distance from the substrate SUB increases. Accordingly, outer regions of the gate conductive layers GE may have a stair-stepped shape. First and second gate contacts GCT1 and GCT2 may be formed in the outer regions of the gate conductive layers GE. Again for convenience of illustration, the first and second gate contacts GCT1 and GCT2 are shown in FIG. 12 arranged side by side in the first direction, however the inventive concept is not limited thereto. Thus, each of the first and second gate contacts GCT1 and GCT2 may be freely disposed in the outer regions of the gate conductive layers GE according to design.

First active contacts ACT1 may be formed in active regions of the first pass transistors TR_P1. The first gate contacts GCT1 of the gate conductive layers GE and the first active contacts ACT1 may be connected to each other through a wiring line (not shown). Accordingly, the gate conductive layers GE may receive a driving voltage through the first pass transistors TR_P1. Second active contacts ACT 2 may be formed in active regions of the second pass transistors TR_P2 formed in the second row decoder area RD2. The second gate contacts GCT2 of the gate conductive layers GE and the second active contacts ACT2 may be connected to each other through a wiring line (not shown). Accordingly, the gate conductive layers GE may receive a driving voltage through the second pass transistors TR_P2. However, as the number of signal lines increases, a space for arranging wiring lines connecting active contacts and gate contacts may progressively narrow. Accordingly, wiring line lengths, thicknesses, and/or shapes may vary in order to eliminate resulting special constraints. As a result, deviation in resistance values of a wiring line connected to multiple word lines may increase. However, as described above with reference to FIGS. 8 and 9, a setup time deviation between the signal lines may be reduced by connecting wiring lines having different resistance values to opposing ends of a signal line.

The gate conductive layers GE may be separated by a word line cut area WLC. Also, the string selection line SSL may be separated by the selection line cut area SLC. The gate conductive layers GE are illustrated as including the first to sixth gate electrodes G1 to G6, however this is just an illustrative example. The number of gate electrodes may vary according to the structure of cell strings included in the memory cell array. For example, as shown in FIGS. 4 and 5, the gate conductive layers GE may include 10 gate electrodes, however nonvolatile memory devices according to embodiments of the inventive concept are not limited thereto.

Figure 13:
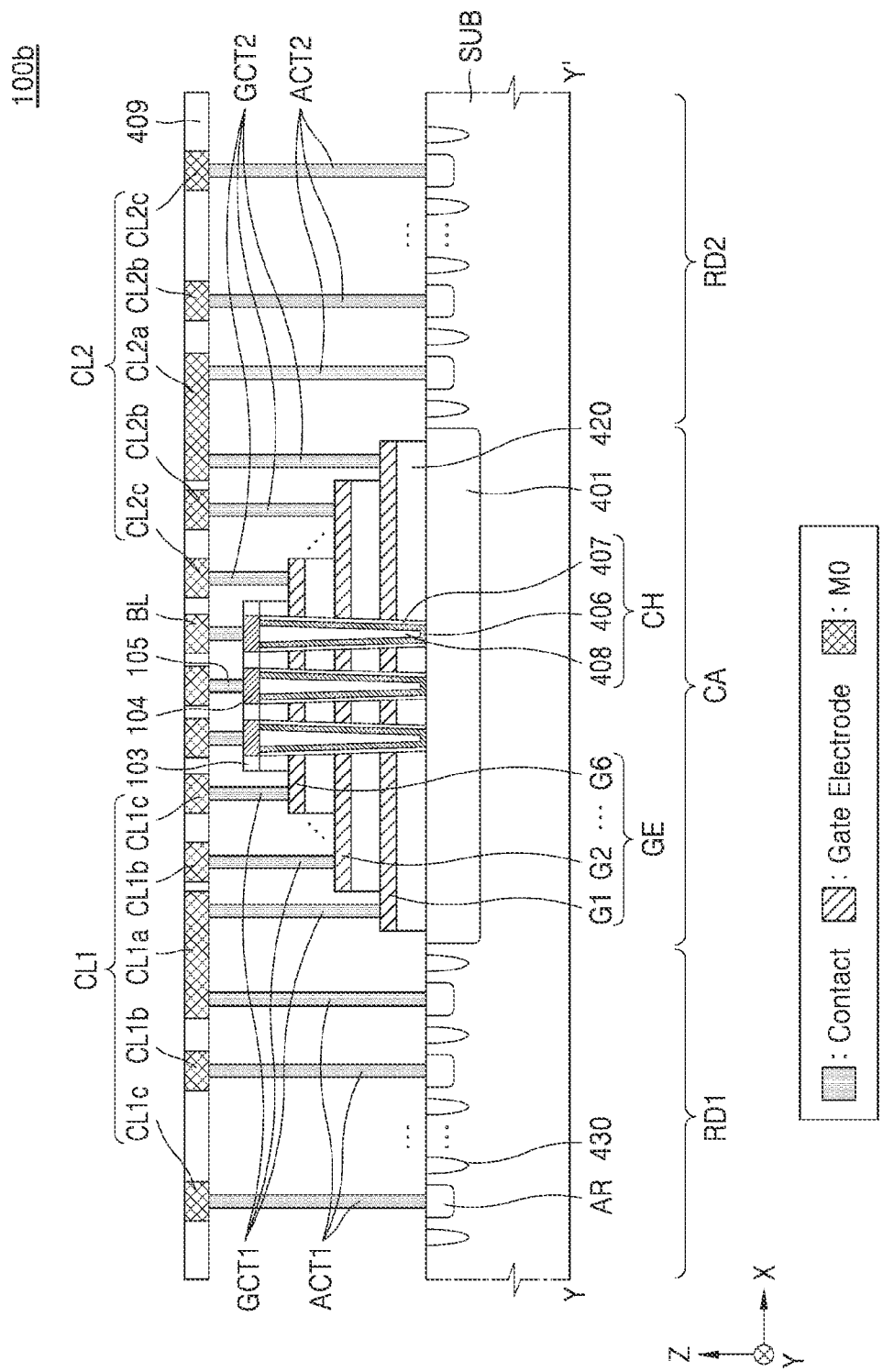
FIG. 13 is a cross-sectional view of a semiconductor device according to embodiments of the inventive concept.

FIG. 13 is a cross-sectional view taken along line Y-Y' of the semiconductor device 100b of FIG. 12. Referring to FIG. 13, a gate insulating layer 420 may be disposed in a lower or upper portion of each of the first to sixth gate electrodes G1 to G6 included in the semiconductor device 100c. The area allocated to the gate electrodes G1 to G6 may decrease with increasing distance from the substrate SUB. Accordingly, outer regions of the gate conductive layers GE may have a stair-stepped shape. The vertically extending first gate contacts GCT1 and second gate contacts GCT2 may be formed in outer regions of the gate conductive layers GE. The first gate contacts GCT1 may be connected to the first wiring lines CL1. The first wiring lines CL1 may be formed on a first wiring layer M0. The first wiring lines CL1 may be connected to the first active contacts ACT1 extending in the third direction. The first active contacts ACT1 may be connected to active areas AR of pass transistors included in the first row decoder area RD1. The second gate contacts GCT2 may be connected to the second wiring lines CL2. The second wiring lines CL2 may be formed on the first wiring layer M0. The second wiring lines CL2 may be connected to the second active contacts ACT2 extending in the third direction. The second active contacts ACT2 may be connected to the active areas AR of pass transistors included in the second row decoder area RD2.

The channel hole CH may pass through the gate conductive layers GE and the gate insulating layers 420 and extend in the third direction, and a bottom surface of the channel hole CH may reach the upper surface of the substrate SUB. The channel hole CH may include a channel layer 406, an insulating layer 407, and a buried insulating layer 408.

The channel layer 406 may pass through the gate conductive layers GE and the gate insulating layers 420 and extend in the third direction perpendicular to an upper surface of a well area 401, and a bottom surface of the channel layer 406 may reach the upper surface of the well area 401. The channel layers 406 may be arranged to be apart by a certain distance in the first direction and the second direction.

For example, the channel layer 406 may include doped polysilicon and/or undoped polysilicon. The channel layer 406 may be formed in a cup shape (or a cylinder shape with a closed bottom) extending in a vertical direction, and the buried insulating layer 408 may be filled on an inner wall of the channel layer 406. The upper surface of the buried insulating layer 408 may be on the same level as the upper surface of the channel layer 406. Alternately, the channel layer 406 may be formed in a pillar shape, and in this case, the buried insulating layer 408 may not be needed.

The insulating layer 407 may be disposed between the channel layer 406 and the gate conductive layers GE. A barrier metal layer may be selectively formed between the insulating layer 407 and the gate conductive layers GE.

A drain area 104 may be formed on the channel layer 406 and the insulating layer 407. For example, the drain area 104 may include doped polysilicon.

An etch stop layer 103 may be formed on a sidewall of the drain area 104. The upper surface of the etch stop layer 103 may be formed on the same level as the upper surface of the drain area 104. The etch stop layer 103 may include an insulating material such as silicon nitride or silicon oxide.

A bit line contact 105 may be formed on the drain area 104, and the bit line BL may be formed on the bit line contact 105. The bit line BL may extend in the second direction, and channel layers arranged in the second direction may be electrically connected to the bit line BL.

Each of the first and second pass transistors TR_P1 and TR_P2 may include a gate, a gate insulating layer, and a source/drain area. Both sidewalls of the gate may be covered with an insulating spacer.

In the first and second row decoder areas RD1 and RD2, an active area AR may be defined by the device isolation layer 430. Here, a P-type well and an N-type well may be formed in the active area AR, and a MOS transistor may be formed on the P-type and N-type wells. The active area AR may constitute a source/drain area of the pass transistor TR_P.

A first insulating layer 409 may be formed on the first and second active contacts ACT1 and ACT2 and the first and second gate contacts GCT1 and GCT2. The first and second wiring lines CL1 and CL2 connected to the first and second active contacts ACT1 and ACT2 and the first and second gate contacts GCT1 and GCT2 may be formed in the first insulating layer 409. The first insulating layer 409 may also be referred to as the first wiring layer M0.

The first wiring lines CL1 may be connected to the active area AR of the first row decoder area RD1, that is, the source/drain area of the pass transistor, through the first active contacts ACT1. The first wiring lines CL1 may be connected to the gate conductive layers GE through the first gate contacts GCT1. As one example, first wiring lines CL1a, CL1b, and CL1c may be modeled as the wiring resistances R11, R12, and R16 of FIG. 7, respectively.

The second wiring lines CL2 may be connected to the active area AR of the second row decoder area RD2, that is, the source/drain area of the pass transistor, through the second active contacts ACT2. The second wiring lines CL2 may be connected to the gate conductive layers GE through the second gate contacts GCT2. As one example, second wiring lines CL2a, CL2b, and CL2c may be modeled as the wiring resistances R21, R22, and R26 of FIG. 7, respectively.

The first and second active contacts ACT1 and ACT2 may include one or more conductive material(s), such as W, Au, Ag, Cu, Al, TiAlN, WN, Ir, Pt, Pd, Ru, Zr, Rh, Ni, Co, Cr, Sn, Zn, etc. Also, the first and second active contacts ACT1 and ACT2 may further include one or more barrier metal layer(s).

Figure 14:
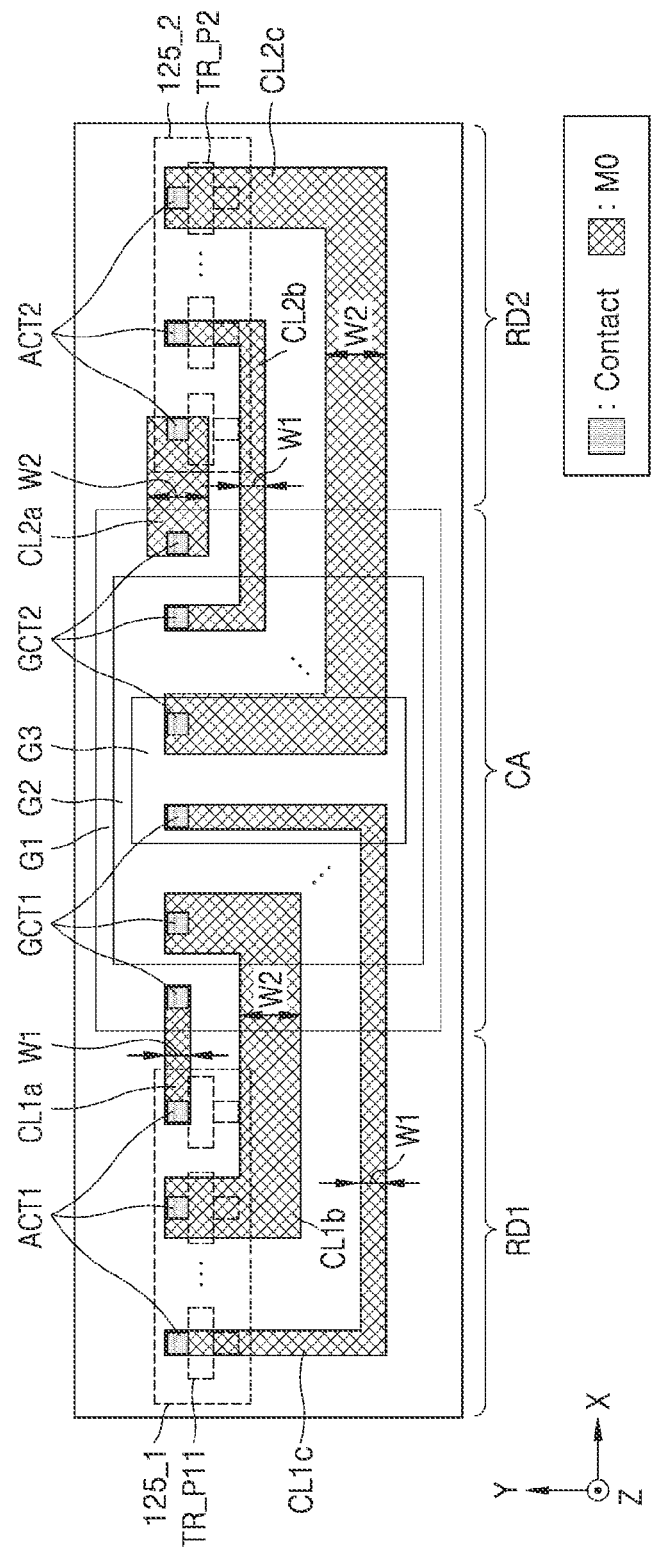
FIG. 14 is a plan view illustrating an example of a wiring line arrangement according to embodiments of the inventive concept.

FIG. 14 is a partial plan view further illustrating in one example a wiring line arrangement according to embodiments of the inventive concept. Referring to FIGS. 12, 13 and 14, the first block selector 125_1 formed in the first row decoder area RD1 may include first pass transistors TR_P1. Each of the first pass transistors TR_P1 may be connected to the first thorough sixth gate electrodes G1 to G6 of the corresponding memory cell array area CA. Here, through the first active contacts ACT11, ACT12, and ACT16, the first wiring lines CL1a, CL1b, and CL1c, the first gate contacts GCT11, GCT12, and GCT16, the first pass transistors TR_P1 formed in the row decoder area RD1 and the first thorough sixth gate electrodes G1 to G6 corresponding thereto may be connected. The second block selector 125_2 formed in the second row decoder area RD2 may include the second pass transistors TP_P2. Each of the second pass transistors TR_P2 may be connected to the first through sixth gate electrodes G1 to G6 of the corresponding memory cell array area CA. Here, through the second active contacts ACT21, ACT22, and ACT26, the second wiring lines CL2a, CL2b and CL2c, and the second gate contacts GCT21, GCT22, and GCT26, the second pass transistors TR_P2 formed in the second row decoder area RD2 and the first through sixth gate electrodes G1 to G6 corresponding thereto may be connected.

Wiring lines connected to opposing ends of one gate electrode may have different widths. For example, the first wiring line CL1a connecting the first gate electrode G1 to the first block selector 125_1 may have a first width W1, and the second wiring line CL2a connecting the first gate electrode G1 to the second the block selector 125_2 may have a second width W2. Accordingly, resistance values for wiring lines connected to opposing ends of one gate electrode may be different. As described above in relation to FIGS. 8 and 9, when wiring resistances having different resistance values are connected to opposing ends of a word line, a setup time deviation among multiple word lines may be reduced.

Figure 15:
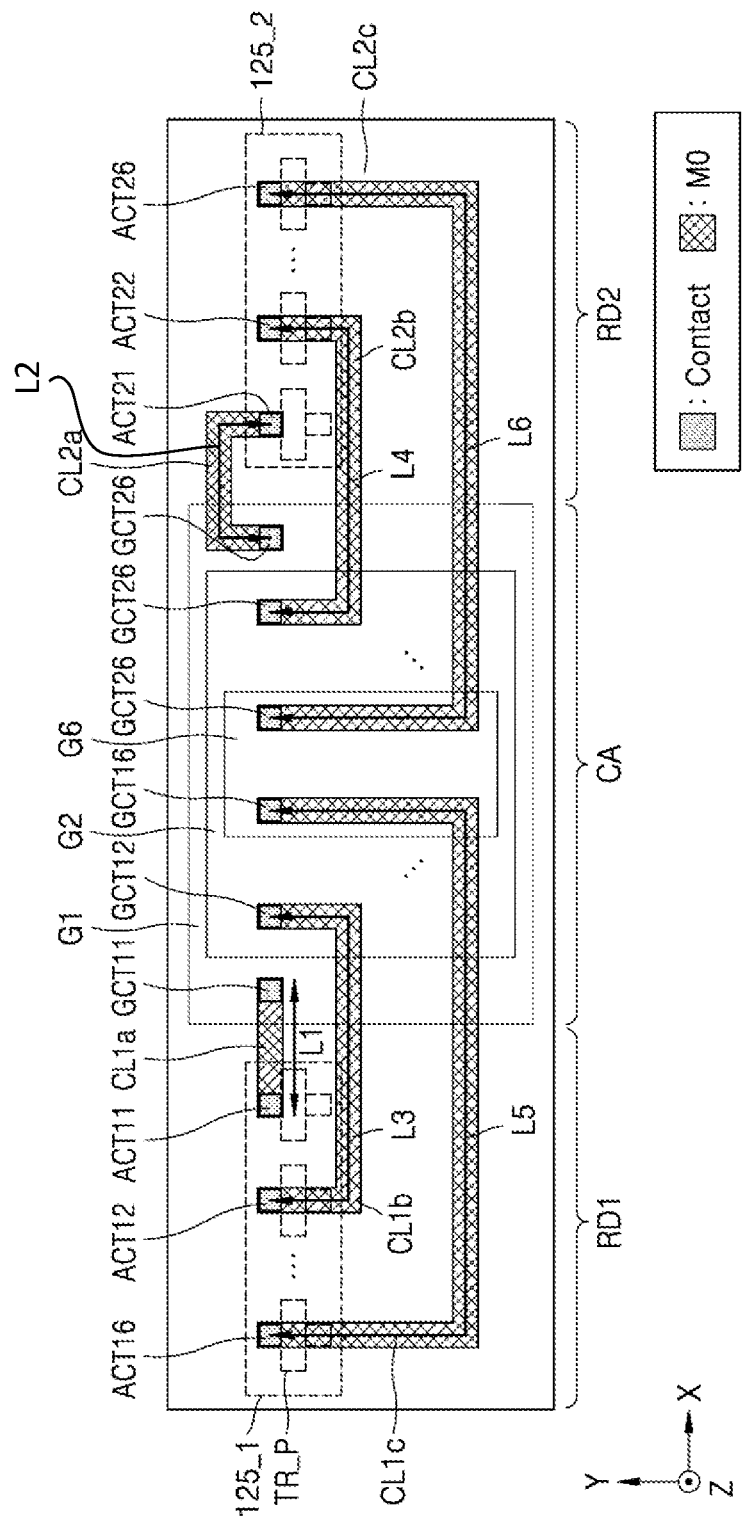
FIG. 15 is a plan view illustrating an example of a wiring line arrangement according to embodiments of the inventive concept.

FIG. 15 is a plan view illustrating in one example a wiring line arrangement according to embodiments of the inventive concept. Referring to FIG. 15, wiring lines connected to opposing ends of one gate electrode may have different lengths. For example, the wiring line CL1a connecting the first gate electrode G1 to the first block selector 125_1 may have a first length L1, and the second wiring line CL1b connecting the first gate electrode G1 to the second block selector 125_2 may have a second length L2. In addition, the wiring line CL2a connecting the second gate electrode G2 to the first block selector 125_1 may have a third length L3, and the wiring line CL2b connecting the second gate electrode G2 to the second block selector 125_2 may have a fourth length L4. Further, the wiring line CL1c connecting the sixth gate electrode G6 to the first block selector 125_1 may have a fifth length L5, and the wiring line CL2c connecting the sixth gate electrode G6 to the second block selector 125_2 may have a sixth length L6.

Thus, resistance values for the wiring lines connected to opposing ends of one gate electrode may be different. As described above in relation to FIGS. 8 and 9, when wiring resistances having different resistance values are connected to opposing ends of a word line, a setup time deviation among multiple word lines may be reduced.

Figure 16:
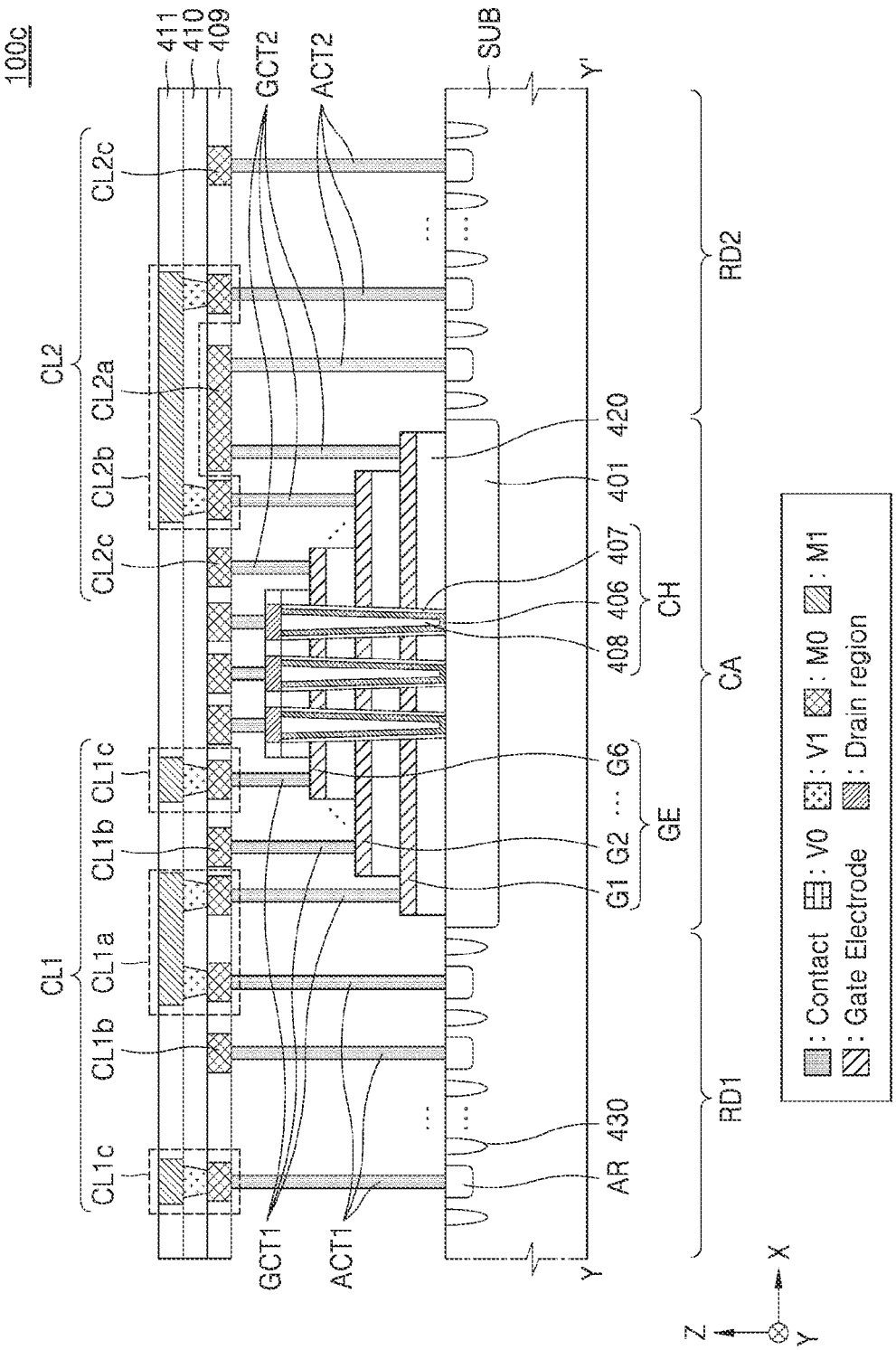
FIG. 16 is a plan view illustrating an example of a wiring line arrangement according to embodiments of the inventive concept.

FIG. 16 is a cross-sectional view illustrating in one example a wiring line arrangement for a nonvolatile memory device 100c according to embodiments of the inventive concept. Referring to FIG. 16, a second insulating layer 410 and a third insulating layer 411 may be formed on the first insulating layer 409. A via penetrating the second insulating layer 410 may be connected to a wiring line formed in the first insulating layer 409. A wiring line formed on the third insulating layer 411 may be connected to the via of the second insulating layer 410. The second insulating layer 410 may be referred to as a first via layer, and the third insulating layer 411 may be referred to as a second wiring layer. The number of wiring layers and via layers is not limited thereto.

At least one of the first wiring lines CL1 may be formed on a plurality of insulating layers. For example, the first wiring line CL1c may be formed on the first, second and third insulating layers 409, 410 and 411. Because the wiring line is formed on the plurality of insulating layers, the length of the wiring line may increase and the resistance of the wiring line may increase accordingly.

A number of insulating layers in which wiring lines connected to opposing ends of the gate electrode may vary by design. For example, a first number of insulating layers among the plurality of insulating layers in which the first wiring line CL1c connected to the sixth gate electrode G6 is formed may be different from a second number of insulating layers in which the second wiring line CL2c is formed. For example, the first wiring line CL1c may be formed on three insulating layers, while the second wiring line CL2c may be formed on one insulating layer. Accordingly, the magnitude of the wiring resistance connected to opposing ends of the gate electrode may be different.

Figure 17:
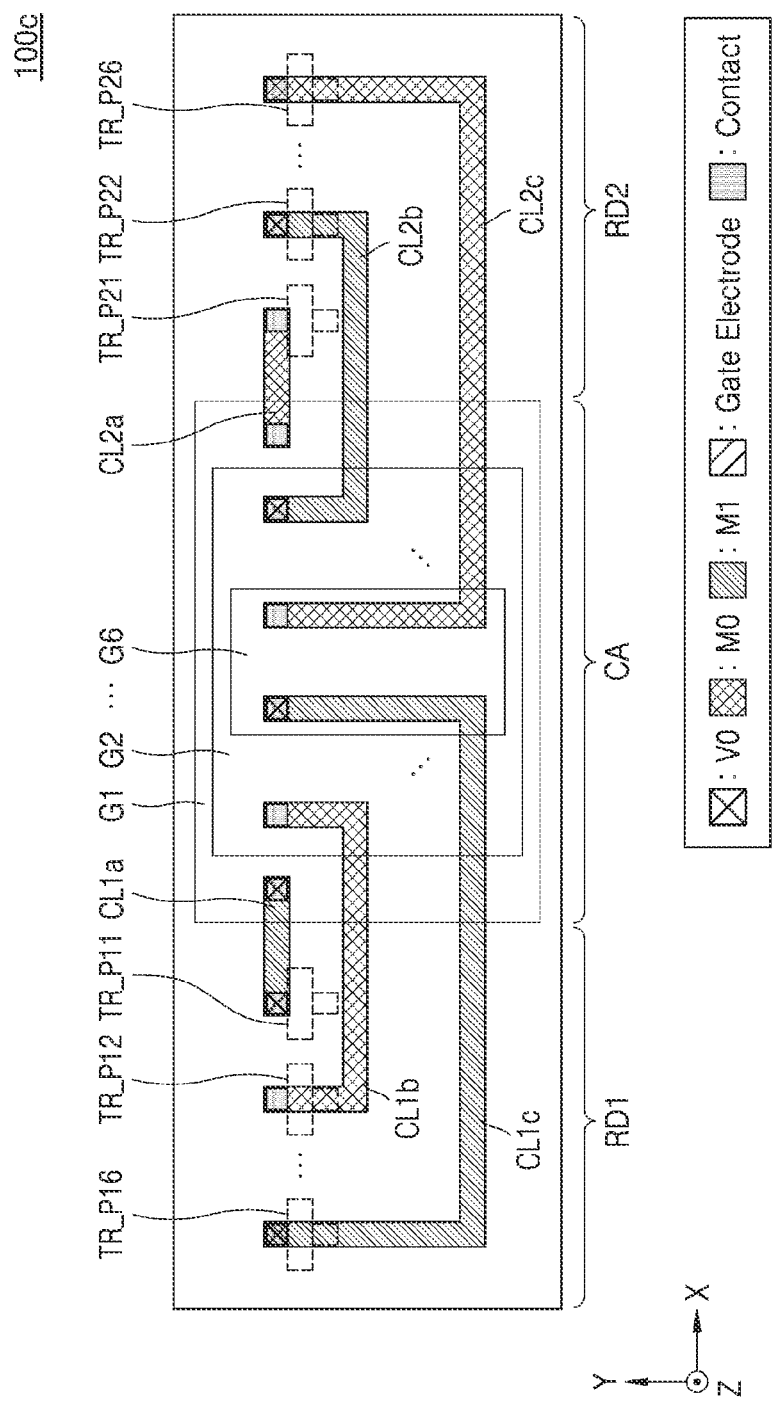
FIG. 17 is a plan view illustrating an example of a wiring line arrangement according to embodiments of the inventive concept.

FIG. 17 is a plan view illustrating in another example a wiring line arrangement according to embodiments of the inventive concept. Here, FIG. 17 shows the top-down, horizontal plane (e.g., an X/Y plane) of the nonvolatile memory device 100c of FIG. 16. Wiring lines connected to opposing ends of the gate electrode may be formed on respectively different numbers of insulating layers among a plurality of insulating layers. The first wiring line CL1a may be formed on the first wiring layer M0, the first via layer V0, and the second wiring layer M1, and the second wiring line CL2a may be formed on the first wiring layer M0. Resistance of the wiring line may increase as the number of wiring layers in which the wiring line is formed increases. Therefore, the resistance of the first wiring line CL1a may be greater than the resistance of the second wiring line CL2a.

As a result, respective ON-resistances for pass transistors connected to opposing ends of the gate electrode may be varied to compensate for wiring line resistance. For example, when the resistance of the first wiring line CL1a is greater than the resistance of the second wiring line CL2a, the ON-resistance of the pass transistor TR_P11 may be less than the ON-resistance of the pass transistor TR_P21.

Figure 18:
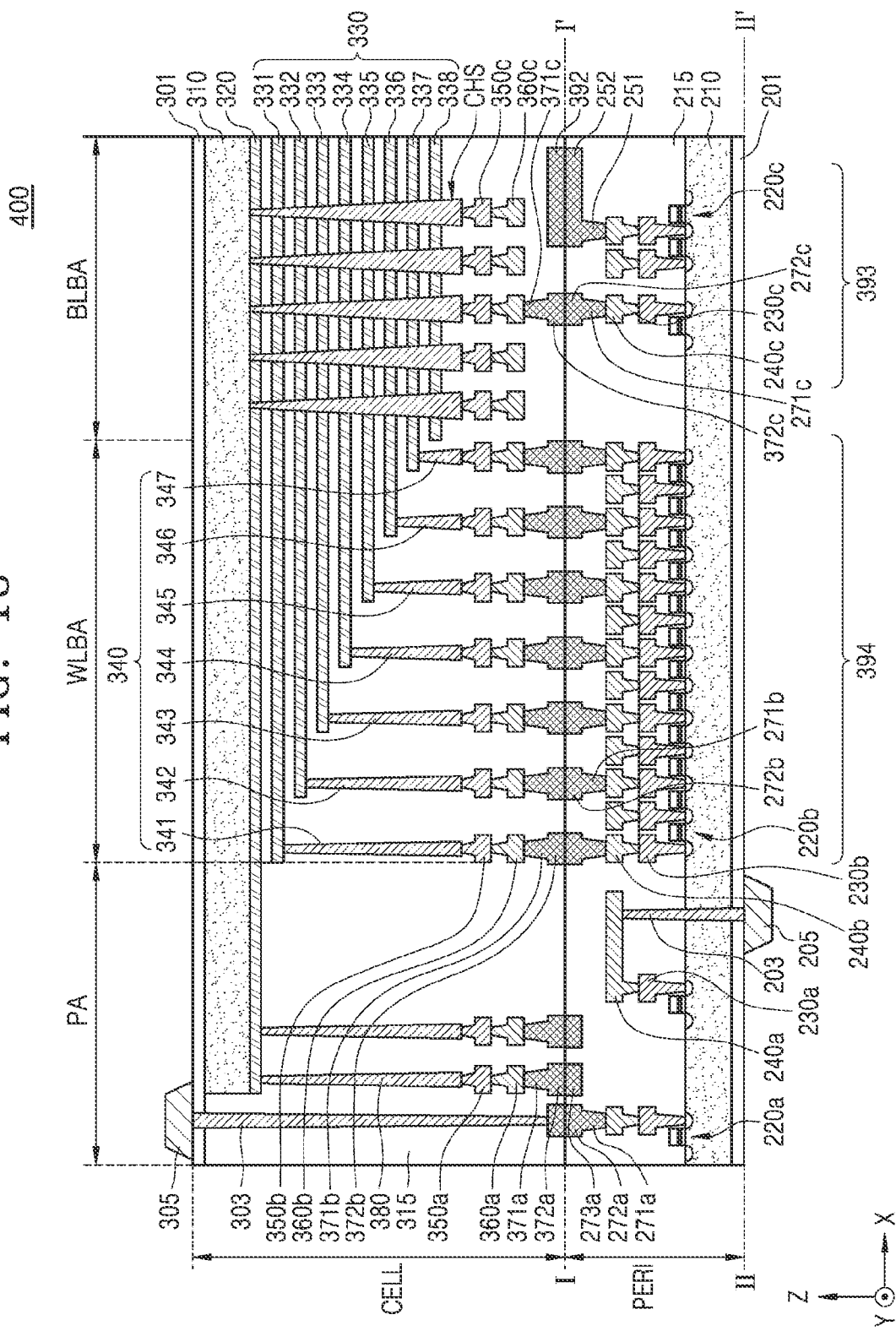
FIG. 18 is a diagram illustrating a memory device according to embodiments of the inventive concept.

FIG. 18 is a cross-sectional diagram illustrating a memory device 400 according to embodiments of the inventive concept. Referring to FIG. 18, the memory device 400 may have a chip-to-chip (C2C) structure, wherein an upper chip including a cell area CELL is manufactured on a first wafer, and a lower chip including the peripheral circuit area PERI is manufactured on a second wafer different from the first wafer. Then, the upper chip and the lower chip are connected using a chip bonding technique. For example, the bonding technique may be a method of electrically connecting a bonding metal formed on an uppermost metal layer of an upper chip to a bonding metal formed on an uppermost metal layer of a lower chip. In some embodiments, the bonding metal may include copper (Cu) and the bonding technique may be a Cu—Cu bonding technique. Here, the bonding metal may also include aluminum or tungsten.

Each of the peripheral circuit area PERI and the cell area CELL of the memory device 400 may include an external pad bonding area PA, a word line bonding area WLBA, and a bit line bonding area BLBA.

The peripheral circuit area PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220*a*, 220*b*, and 220*c*, and second metal layers 240*a*, 240*b*, and 240*c* formed on the first metal layers 230*a*, 230*b*, and 230*c*. In some embodiments, the first metal layers 230*a*, 230*b*, and 230*c* may include tungsten having a relatively high resistance, and the second metal layers 240*a*, 240*b*, and 240*c* may include copper having a relatively low resistance. The peripheral circuit area PERI may include the first row decoder 121 and the second row decoder 126 described above with reference to FIG. 2. That is, one of the plurality of circuit elements 220*a*, 220*b*, and 220*c* may be a pass transistor.

In the illustrated examples, only the first metal layers 230*a*, 230*b*, and 230*c* and the second metal layers 240*a*, 240*b*, and 240*c* are shown and described, but those skilled in the art will understand that at least one additional metal layer may be formed on the second metal layers 240*a*, 240*b*, and 240*c*. For example, at least some of the one or more metal layers formed on the second metal layers 240*a*, 240*b*, and 240*c* may include aluminum or the like having a lower resistance than copper forming the second metal layers 240*a*, 240*b*, and 240*c*.

The interlayer insulating layer 215 may be disposed on the first substrate 210 to cover the plurality of circuit elements 220*a*, 220*b*, and 220*c*, the first metal layers 230*a*, 230*b*, and 230*c*, and the second metal layers 240*a*, 240*b*, and 240*c* and may include an insulating material such as silicon oxide or silicon nitride.

Lower bonding metals 271*b* and 272*b* may be formed on the second metal layer 240*b* of the word line bonding area WLBA. In the word line bonding area WLBA, the lower bonding metals 271*b* and 272*b* of the peripheral circuit area PERI may be electrically connected to upper bonding metals 371*b* and 372*b* of the cell area CELL by using the bonding method, and the lower bonding metals 271*b* and 272*b* and the upper bonding metals 371*b* and 372*b* may include aluminum, copper, or tungsten.

The cell area CELL may provide at least one memory block. The cell area CELL may include a second substrate 310 and a common source line 320. On the second substrate 310, word lines 331 to 338; 330 may be vertically stacked in a direction perpendicular to an upper surface of the second substrate 310. String selection lines and a ground selection line may be disposed on upper and lower portions of each of the word lines 330, and the word lines 330 may be disposed between the string selection lines and the ground selection line.

In the bit line bonding area BLBA, the channel structure CH may extend in the third direction perpendicular to the upper surface of the second substrate 310 and penetrate the word lines 330, the string selection lines, and the ground selection line. The channel structure CHS may include a data storage layer, a channel layer, and a buried insulating layer, and the channel layer may be electrically connected to a first metal layer 350*c* and a second metal layer 360*c*. For example, the first metal layer 350*c* may be a bit line contact, and the second metal layer 360*c* may be a bit line. In some embodiments, the bit line may extend in a second direction parallel to the upper surface of the second substrate 310.

In the illustrated embodiment of FIG. 18, a region in which the channel structure CH and the bit line are disposed may be defined as the bit line bonding area BLBA. The bit line may be electrically connected to the circuit elements 220*c* providing a page buffer 393 in the peripheral circuit area PERI in the bit line bonding area BLBA. For example, the bit line may be connected to upper bonding metals 371*c* and 372*c* in the peripheral circuit area PERI, and the upper bonding metals 371*c* and 372*c* may be connected to lower bonding metals 271*c* and 272*c* connected to the circuit elements 220*c* of the page buffer 393.

In the word line bonding area WLBA, the word lines 330 may extend in a first direction parallel to the upper surface of the second substrate 310, and may be connected to cell contact plugs 341 to 347; 340. The word lines 330 and the cell contact plugs 340 may be connected to each other by pads provided by extending at least some of the word lines 330 to different lengths in the first direction. The cell contact plugs 340 may be the gate contacts GCT1 and GCT2 described above with reference to FIG. 12. A first metal layer 350*b* and a second metal layer 360*b* may be sequentially connected on upper portions of the cell contact plugs 340 connected to the word lines 330. The cell contact plugs 340 may be connected to the peripheral circuit area PERI through the upper bonding metals 371*b* and 372*b* of the cell area CELL and the lower bonding metals 271*b* and 272*b* of the peripheral circuit area PERI in the word line bonding area WLBA. The cell contact plugs 340 may be connected to a pass transistor of a row decoder through the lower bonding metals 271*b* and 272*b*, the upper bonding metals 371*b* and 372*b*, the second metal layer 360*b*, and the first metal layer 350*b*. In FIG. 18, the lower bonding metals 271*b* and 272*b*, the upper bonding metals 371*b* and 372*b*, the second metal layer 360*b*, and the first metal layer 350*b* may be referred to as wiring lines. As a result of the foregoing, certain memory devices according to embodiments of the inventive concept may reduce a setup time deviation between word lines by making the resistance of wiring lines connected to opposing word line ends different.

The cell contact plugs 340 may be electrically connected to the circuit elements 220*b* providing the row decoder 394 in the peripheral circuit area PERI. In some embodiments, operating voltages of the circuit elements 220*b* providing the row decoder 394 may be different from the operating voltages of the circuit elements 220*c* providing the page buffer 393. For example, the operating voltages of the circuit elements 220*c* providing the page buffer 393 may be greater than the operating voltages of the circuit elements 220*b* providing the row decoder 394. For convenience of description, only one row decoder is shown, but the peripheral circuit area PERI may include multiple row decoders. Here, however, the cell contact plugs 340 may be formed at opposing ends of the word lines 330.

A common source line contact plug 380 may be disposed in the external pad bonding area PA. The common source line contact plug 380 may include a conductive material such as a metal, a metal compound, or polysilicon, and may be electrically connected to the common source line 320. The first metal layer 350*a* and the second metal layer 360*a* may be sequentially stacked on the common source line contact plug 380. For example, a region in which the common source line contact plug 380, the first metal layer 350*a*, and the second metal layer 360*a* are disposed may be defined as the external pad bonding area PA.

Here, first and second I/O pads 205 and 305 may be disposed in the external pad bonding area PA. Referring to FIG. 18, a lower insulating layer 201 covering a lower surface of the first substrate 210 may be formed on the lower portion of the first substrate 210, and the first I/O pad 205 may be formed on the lower insulating layer 201. The first I/O pad 205 may be connected to at least one of the circuit elements 220*a*, 220*b*, and 220*c* disposed in the peripheral circuit area PERI through a first I/O contact plug 203, and may be separated from the first substrate 210 by the lower insulating layer 201. In addition, a side insulating layer may be disposed between the first I/O contact plug 203 and the first substrate 210 to electrically separate the first I/O contact plug 203 and the first substrate 210.

Referring to FIG. 18, an upper insulating layer 301 covering the upper surface of the second substrate 310 may be formed on the second substrate 310, and the second I/O pad 305 may be formed on the upper insulating layer 301. The second I/O pad 305 may be connected to at least one of the circuit elements 220a, 220b, and 220c disposed in the peripheral circuit area PERI through the second I/O contact plug 303.

In some embodiments, the second substrate 310 and the common source line 320 may not be disposed in a region in which the second I/O contact plug 303 is disposed. Also, the second I/O pad 305 may not overlap with the word lines 330 in the third direction. Referring to FIG. 18, the second I/O contact plug 303 may be separated from the second substrate 310 in a direction parallel to the upper surface of the second substrate 310, and penetrate the interlayer insulating layer 315 of the cell area CELL and be connected to the second I/O pad 305.

In some embodiments, the first I/O pad 205 and the second I/O pad 305 may be selectively formed. For example, the memory device 400 may include only the first I/O pad 205 disposed on the upper portion of the first substrate 210, or only the second I/O pad 305 disposed on the upper portion of the second substrate 310. Alternatively, the memory device 400 may include both the first I/O pad 205 and the second I/O pad 305.

In each of the external pad bonding area PA and the bit line bonding area BLBA included in each of the cell area CELL and the peripheral circuit area PERI, a metal pattern of the uppermost metal layer may be present as a dummy pattern, or the uppermost metal layer may be empty.

In the external pad bonding area PA, the memory device 400 may form the lower metal pattern 273a having the same shape as the upper metal pattern 372a on the uppermost metal layer of the peripheral circuit area PERI in correspondence to the upper metal pattern 372a formed on the uppermost metal layer of the cell area CELL The lower metal pattern 273a formed on the uppermost metal layer of the peripheral circuit area PERI may not be connected to a separate contact in the peripheral circuit area PERI. Similarly, in the external pad bonding area PA, an upper metal pattern, corresponding to the lower metal pattern formed in an uppermost metal layer of the peripheral circuit area PERI, and having the same shape as a lower metal pattern of the peripheral circuit area PERI, may be formed in an uppermost metal layer of the cell area CELL.

The lower bonding metals 271b and 272b may be formed on the second metal layer 240b of the word line bonding area WLBA. In the word line bonding area WLBA, the lower bonding metals 271b and 272b of the peripheral circuit area PERI may be electrically connected to the upper bonding metals 371b and 372b of the cell area CELL by using the bonding method.

In addition, in the bit line bonding area BLBA, the upper metal pattern 392 having the same shape as the lower metal pattern 252 of the peripheral circuit area PERI on the uppermost metal layer of the cell area CELL in correspondence to the lower metal pattern 252 may be formed on the uppermost metal layer of the peripheral circuit area PERI. A contact may not be formed on the upper metal pattern 392 formed on the uppermost metal layer of the cell area CELL.

Figure 19:
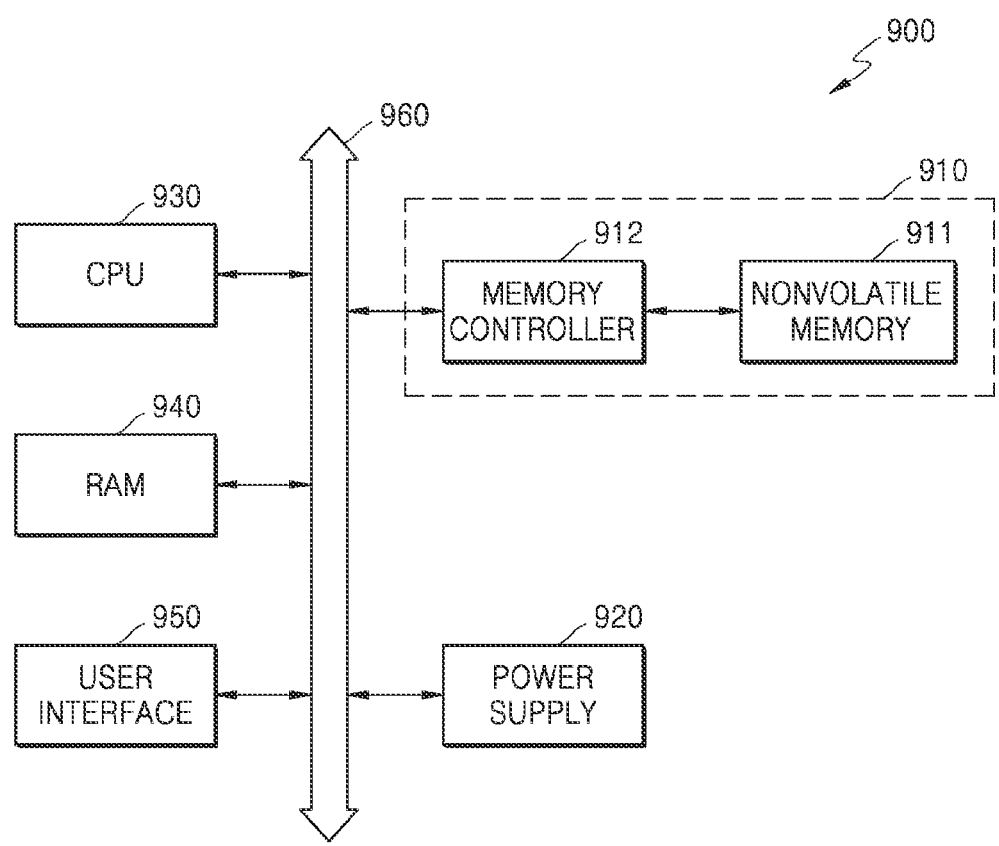
FIG. 19 is a diagram illustrating a computing system device including a nonvolatile memory device according to embodiments of the inventive concept.

FIG. 19 is a block diagram illustrating a computing system 900 including a nonvolatile memory system 910 according to embodiments of the inventive concept.

Referring to FIG. 19, the computing system 900 may further include a CPU 930 and a user interface 950 electrically connected via a bus 960. Here, the nonvolatile memory system 910 may include a memory controller 912 and a nonvolatile memory device 911.

The nonvolatile memory device 911 may be variously configured according to one or more of the embodiments previously described in relation to FIGS. 1 to 18. Accordingly, the nonvolatile memory system 910 may include various signal lines to which wiring lines having different resistances may be connected at opposing ends, such that setup time deviation(s) among the signal lines may be reduced.

The computing system device 900 may further include a RAM 940 and a power supply 920.

When the computing system 900 is implemented as a mobile device, a battery for supplying the operating voltage of a computing system and a modem such as a baseband chipset may additionally be provided. Further, the computing system 900 may further include one or more of an application chipset, a camera image processor (CIS), mobile DRAM, etc.

Here, the nonvolatile memory system 910, including the memory controller 912 and the nonvolatile memory device 911 may constitute, for example, a solid state drive/disk (SSD).

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
   a memory cell array including memory cells commonly connected to a first signal line;
   a voltage generator configured to generate a driving voltage applied to the first signal line;
   a first row decoder including a first pass transistor configured to provide the driving voltage to a first wiring line having a first resistance, wherein the driving voltage is applied at a first end of the first signal line through the first wiring line; and
   a second row decoder including a second pass transistor configured to provide the driving voltage to a second wiring line having a second resistance, wherein the driving voltage is applied at a second end of the first signal line through the second wiring line,
   wherein the first resistance and the second resistance are different.

2. The nonvolatile memory device of claim 1, wherein the first wiring line includes a first number of wiring layers among a plurality of wiring layers, and the second wiring line includes a second number of wiring layers among the plurality of wiring layers different from the first number of wiring layers.

3. The nonvolatile memory device of claim 1, wherein a first length of the first wiring line is different from a second length of the second wiring line.

4. The nonvolatile memory device of claim 1, wherein a first width of the first wiring line is different from a second width of the second wiring line.

5. The nonvolatile memory device of claim 1, wherein a first ON-resistance of the first pass transistor is different from a second ON-resistance of the second pass transistor.

6. The nonvolatile memory device of claim 5, wherein a first size of the first pass transistor is different from a second size of the second transistor.

7. The nonvolatile memory device of claim 5, wherein the first resistance of the first wiring line is greater than the second resistance of the second wiring line, and
the first ON-resistance of the first pass transistor is less than a second ON-resistance of the second pass transistor.

8. The nonvolatile memory device of claim 1, wherein the memory cell array further comprises memory cells commonly connected to a second signal line,
the first row decoder is further configured to provide the driving voltage at a first end of the second signal line through a third wiring line,
the second row decoder is further configured to provide the driving voltage to a second end of the second signal line through a fourth wiring line,
the first resistance of the first wiring line is greater than a third resistance of the third wiring line, and
the second resistance of the second wiring line is less than a fourth resistance of the fourth wiring line.

9. The nonvolatile memory device of claim 1, wherein the memory cell array is disposed in a memory cell area of a substrate, the first row decoder is disposed in a first row decoder area on one side of the memory cell area, and the second row decoder is disposed in a second row decoder area arranged in parallel with the first row decoder area and on another side of the memory cell area.

10. The nonvolatile memory device of claim 1, wherein the memory cell array is disposed on a first substrate,
the first row decoder is disposed in a first row decoder area of a second substrate, and the second row decoder is disposed in a second row decoder area of the second substrate, wherein the first row decoder area is separated from the second row decoder area in a first direction, and
the first substrate and the second substrate are connected in a second direction crossing the first direction.

11. A memory device comprising:
a memory cell array disposed in a memory cell area of a substrate, a first row decoder disposed in a first row decoder area of the substrate horizontally adjacent to one side of the memory cell area, and a second row decoder disposed in a second row decoder area of the substrate horizontally adjacent to another side of the memory cell area opposing the one side of the memory cell area; and
a first signal line and a second signal line extending in parallel across the memory cell area between the first row decoder and the second row decoder,
wherein the first row decoder includes first pass transistors configured to provide a driving voltage to one end of the first signal line through a first wiring line, and further configured to provide the driving voltage to one end of the second signal line through a second wiring line,
the second row decoder includes second pass transistors configured to provide the driving voltage to an opposing end of the first signal line through a third wiring line, and further configured to provide the driving voltage to an opposing end of the second signal line through a fourth wiring line,
the first wiring line having a first resistance value and the second wiring line having second resistance value different from the first resistance value, and the third wiring line having a third resistance value and the fourth wiring line having fourth resistance value different from the third resistance value.

12. The memory device of claim 11, wherein the first wiring line has a first length and the second wiring line has a second length different from the first length, and
the third wiring line has a third length and the fourth wiring line has a fourth length different from the third length.

13. The memory device of claim 11, wherein the first wiring line has a first width and the second wiring line has a second width different from the first width, and
the third wiring line has a third width and the fourth wiring line has a fourth width different from the third width.

14. The memory device of claim 11, wherein respective ON-resistances of the first pass transistors are different from one another, and respective ON-resistances of the second pass transistors are different from one another.

15. The memory device of claim 14, wherein respective sizes of the first pass transistors are different from one another, and respective sizes of the second pass transistors are different from one another.

16. The memory device of claim 11, wherein the first wiring line includes a first number of wiring layers among a plurality of wiring layers,
the second wiring line includes a second number of wiring layers among the plurality of wiring layers different from the first number of wiring layers,
the third wiring line includes a third number of wiring layers among the plurality of wiring layers, and
the fourth wiring line includes a fourth number of wiring layers among the plurality of wiring layers different from the third number of wiring layers.

17. A nonvolatile memory device comprising:
a memory cell array including memory cells commonly connected to a first signal line;
a first row decoder including a first pass transistor configured to provide a driving voltage to one end of the first signal line; and
a second row decoder including a second pass transistor configured to provide the driving voltage to an opposing end of the first signal line,
wherein an ON-resistance of the first pass transistor is different from an ON-resistance of the second pass transistor.

18. The nonvolatile memory device of claim 17, further comprising:
a first wiring line having a first resistance connecting the first pass transistor and the one end of the first signal line; and
a second wiring line having a second resistance different from the first resistance connecting the second pass transistor and the opposing end of the first signal line.

19. The nonvolatile memory device of claim 18, wherein the first wiring line has a first length and the second wiring line has a second length different from the first length.

20. The nonvolatile memory device of claim 18, wherein the first wiring line has a first width and the second wiring line has a second width different from the first width.

* * * * *